United States Patent
Yamazaki et al.

(10) Patent No.: US 7,372,199 B2
(45) Date of Patent: *May 13, 2008

(54) LIGHT EMITTING DEVICE AND IMAGE PLAYBACK DEVICE HAVING TRIPLET AND SINGLET COMPOUNDS IN ELECTROLUMINESCENT LAYER

(75) Inventors: Shunpei Yamazaki, Setagaya (JP); Takeshi Nishi, Atsugi (JP); Mayumi Mizukami, Atsugi (JP); Hisao Ikeda, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/727,309

(22) Filed: Mar. 26, 2007

(65) Prior Publication Data

US 2007/0170853 A1    Jul. 26, 2007

Related U.S. Application Data

(62) Division of application No. 11/393,762, filed on Mar. 31, 2006, now Pat. No. 7,199,519, which is a division of application No. 11/045,311, filed on Jan. 31, 2005, now Pat. No. 7,042,151, which is a division of application No. 09/938,291, filed on Aug. 24, 2001, now Pat. No. 6,864,628.

(30) Foreign Application Priority Data

Aug. 28, 2000   (JP)   ............... 2000-258260

(51) Int. Cl.
    *H05B 33/00*   (2006.01)
(52) U.S. Cl. .............. 313/504; 313/500; 313/505; 313/506; 428/690; 428/917
(58) Field of Classification Search ............... 313/506
    See application file for complete search history.

(56) References Cited

U.S. PATENT DOCUMENTS 4,974,942 A    12/1990   Gross et al.

(Continued)

FOREIGN PATENT DOCUMENTS

EP    0390551    10/1990

(Continued)

OTHER PUBLICATIONS

D.F. O'Brien et al., "Improved Engergy Transfer in Electrophosphorescent Devices," Applied Physics Letters, vol. 74, No. 3, Jan. 18, 1999, pp. 442-444.

(Continued)

*Primary Examiner*—Sikha Roy
(74) *Attorney, Agent, or Firm*—Eric J. Robinson; Robinson Intellectual Property Law Office, P.C.

(57) ABSTRACT

The luminance of different colors of light emitted from EL elements in a pixel portion of a light emitting device is equalized and the luminance of light emitted from the EL elements is raised. The pixel portion of the light emitting device has EL elements whose EL layers contain triplet compounds and EL elements whose EL layers contain singlet compounds in combination. The luminance of light emitted from the plural EL elements is thus equalized. Furthermore, a hole transporting layer has a laminate structure to thereby cause the EL elements to emit light of higher luminance.

17 Claims, 25 Drawing Sheets

U.S. PATENT DOCUMENTS

| | | | |
|---|---|---|---|
| 5,216,331 | A | 6/1993 | Hosokawa et al. |
| 5,294,810 | A | 3/1994 | Egusa et al. |
| 5,457,565 | A | 10/1995 | Namiki et al. |
| 5,485,055 | A | 1/1996 | Keyser |
| 5,703,436 | A | 12/1997 | Forrest et al. |
| 5,742,129 | A | 4/1998 | Nagayama et al. |
| 5,756,224 | A | 5/1998 | Borner et al. |
| 5,928,802 | A | 7/1999 | Shi et al. |
| 5,932,892 | A | 8/1999 | Hseuh et al. |
| 5,990,629 | A | 11/1999 | Yamada et al. |
| 6,046,547 | A | 4/2000 | Nishio et al. |
| 6,072,278 | A | 6/2000 | Keyser et al. |
| 6,097,147 | A | 8/2000 | Baldo et al. |
| 6,133,693 | A | 10/2000 | Keyser |
| 6,160,272 | A | 12/2000 | Arai et al. |
| 6,175,345 | B1 | 1/2001 | Kuribayashi et al. |
| 6,191,764 | B1 | 2/2001 | Kono et al. |
| 6,194,837 | B1 | 2/2001 | Ozawa |
| 6,204,610 | B1 | 3/2001 | Komiya |
| 6,303,238 | B1 | 10/2001 | Thompson et al. |
| 6,310,360 | B1 | 10/2001 | Forrest et al. |
| 6,358,633 | B1 | 3/2002 | Sano et al. |
| 6,359,606 | B1 | 3/2002 | Yudasaka |
| 6,420,834 | B2 | 7/2002 | Yamazaki et al. |
| 6,433,486 | B1 | 8/2002 | Yokoyama |
| 6,559,594 | B2 | 5/2003 | Fukunaga et al. |
| 6,608,449 | B2 | 8/2003 | Fukunaga |
| 6,641,933 | B1 | 11/2003 | Yamazaki et al. |
| 6,689,492 | B1 | 2/2004 | Yamazaki et al. |
| 6,730,966 | B2 | 5/2004 | Koyama |
| 6,750,608 | B2 | 6/2004 | Matsuura et al. |
| 6,780,687 | B2 | 8/2004 | Nakajima et al. |
| 6,872,604 | B2 * | 3/2005 | Yamazaki et al. .......... 438/151 |
| 6,878,470 | B2 | 4/2005 | Kawamura et al. |
| 6,910,933 | B1 | 6/2005 | Matsuo et al. |
| 2001/0020922 | A1 | 9/2001 | Yamazaki et al. |
| 2001/0045565 | A1 | 11/2001 | Yamazaki |
| 2001/0049197 | A1 | 12/2001 | Yamazaki et al. |
| 2001/0051207 | A1 | 12/2001 | Yamagata et al. |
| 2002/0024051 | A1 | 2/2002 | Yamazaki et al. |
| 2002/0050786 | A1 | 5/2002 | Yamazaki et al. |
| 2004/0065902 | A1 | 4/2004 | Yamazaki et al. |
| 2005/0140280 | A1 | 6/2005 | Yamazaki et al. |
| 2005/0197031 | A1 | 9/2005 | Yamazaki et al. |
| 2005/0233170 | A1 | 10/2005 | Yamazaki |

FOREIGN PATENT DOCUMENTS

| | | |
|---|---|---|
| GB | 2344346 | 6/2000 |
| JP | 02-261889 | 10/1990 |
| JP | 03-115486 | 5/1991 |
| JP | 03-230583 | 10/1991 |
| JP | 03-230584 | 10/1991 |
| JP | 07-094278 | 4/1995 |
| JP | 10-039791 | 2/1998 |
| JP | 10-148853 | 6/1998 |
| JP | 10-214060 | 8/1998 |
| JP | 10-255983 | 9/1998 |
| JP | 11-111457 | 4/1999 |
| JP | 11-338786 | 12/1999 |
| JP | 2000-089691 | 3/2000 |
| JP | 2000-111721 | 4/2000 |
| JP | 2000-148087 | 5/2000 |
| JP | 2000-150152 | 5/2000 |
| WO | WO-98/33165 | 7/1998 |

OTHER PUBLICATIONS

Tsutsui et al., "Electroluminescence in Organic Thin Films," Photochemical Processes in Organized Molecular Systems, 1991, pp. 437-450.

M. A. Baldo et al., "Highly Efficient Phosphorescent Emission from Organic Electroluminescent Devices," Nature vol. 395, Sep. 10, 1998, pp. 151-154.

M. A. Baldo et al., "Very High-Efficiency Green Organic Light-Emitting Devices Based on Electrophosphorescence," Applied Physics Letters vol. 75, No. 1, Jul. 5, 1999, pp. 4-6.

Tsutsui et al., "High Quantum Efficiency in Organic Light-Emitting Devices with Iridium-Complex as a Triplet Emissive Center," Japanese Journal of Applied Physics, vol. 38, Part 12B, Dec. 15, 1999, pp. L1502-L1504.

Pending Claims for U.S. Appl. No. 09/871,805, filed Jun. 4, 2001 to Yamazaki.

Specification and Pending Claims for U.S. Appl. No. 11/105,414, filed Apr. 14, 2005 to Yamazaki.

Koyama.J et al., "A 4.0-in. Poly Si TFT-LCD With Integrated 6-Bit Digital Data Driver Using CGS Technology ," AM-LCD '99 Digest of Technical Papers , Jul. 1, 1999, pp. 29-32.

Ohtani.H et al., "Late-News Poster: A 60-in. HDTV Rear-Projector With Continuous-Grain-Silicon Technology," SID Digest '98 : SID International Symposium Digest of Technical Papers, May 1, 1998, vol. XXIX, pp. 467-470.

Baldo.M et al., "High-Efficiency Fluorescent Organic Light-Emitting Devices Using a Phosphorescent Sensitizer," Nature, Feb. 17, 2000, vol. 403, pp. 750-753.

Nishi.T et al., "High Efficiency TFT-OLED Display With Iridium-Complex as Triplet Emissive Center," Proceedings of the 10th International Workshop on Inorganic and Organic Electroluminescence (EL'00), Dec. 4, 2000, pp. 353-356.

Inukai.K et al., "4.0-in. TFT-OLED Displays and a Novel Digital Driving Method," SID Digest '00 : SID International Symposium Digest of Technical Papers, 2000, pp. 924-927.

Kido.J et al., "Multilayer White Light-Emitting Organic Electroluminescent Device," Science, Mar. 3, 1995, vol. 267, pp. 1332-1334.

Mizukami.M et al., "6-Bit Digital VGA OLED,", SID Digest '00 : SID International Symposium Digest of Technical Papers, 2000, pp. 912-915.

Kijima. Y, "RGB Multicolor Element," The Japan Society of Applied Physics Molecular Electronics and Bioelectronics Group, the 6th training session, Dec. 11, 1997, pp. 155-163, The Japan Society of Applied Physics Molecular Electroncis and Bioelectronics Group.

The Rise of Organic EL Aiming at 'Mobile Phones', Nikkei Electronics, Mar. 13, 2000, No. 765, pp. 55-62.

Koyama, J, "Taking Basic Patents of Circuit for Achieving Higher Definition of Organic EL Panel," Nikkei Electronics, Apr. 24, 2000, No. 768, pp. 163-170.

"2-mm Thick Self-Emitting Display Device," Nikkei Sangyou Shimbun, Sep. 27, 1995.

Tsutsui et al., "High Quantum Efficiency in Organic Light-Emitting Devices with Iridium-Complex as a Triplet Emissive Center," Japanese Journal of Applied Physics, vol. 38, Part 2, No. 12B, Dec. 15, 1999, pp. L1502-L1504.

Inukai, K. et al., "4.0-In. TFT-OLED Displays And A Novel Digital Driving Method," SID Digest '00 : SID International Symposium Digest of Technical Papers, 2000, vol. XXXI, pp. 924-927.

Mizukami, M. et al., "6-Bit Digital VGA OLED," SID Digest '00 : SID International Symposium Digest of Technical Papers, 2000, vol. XXXI, pp. 912-915.

* cited by examiner

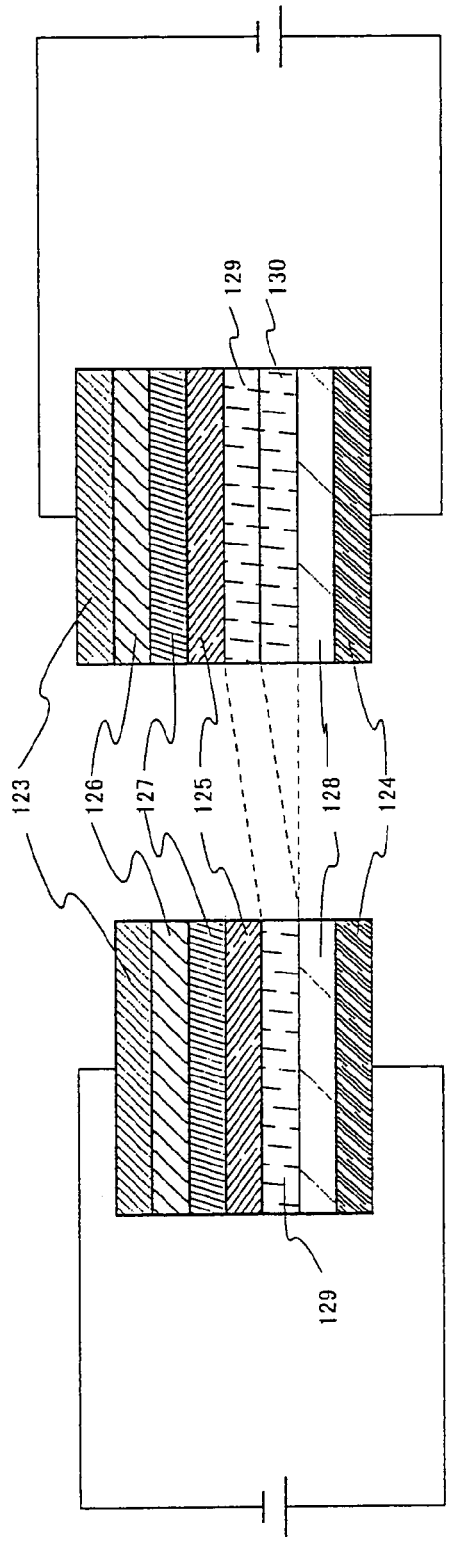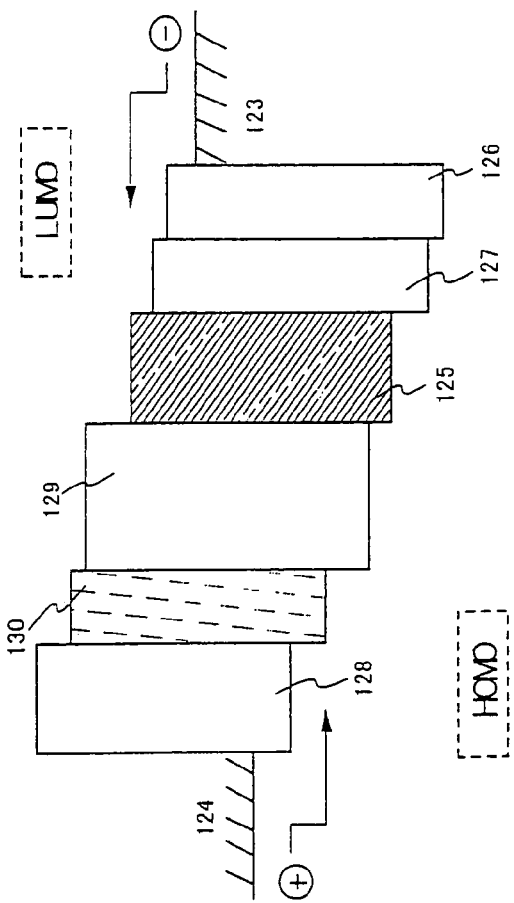
Fig. 2A
Fig. 2B
Fig. 2C

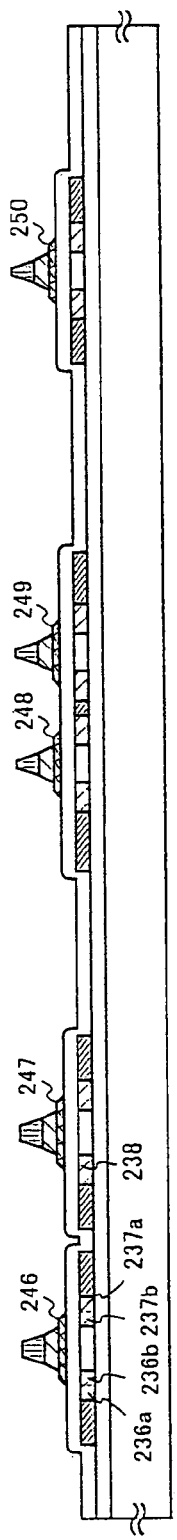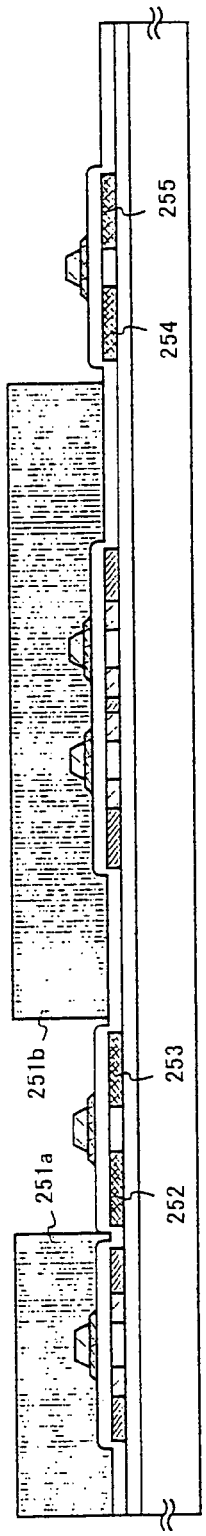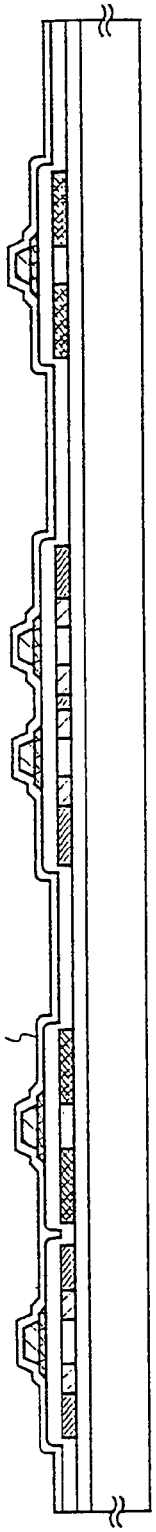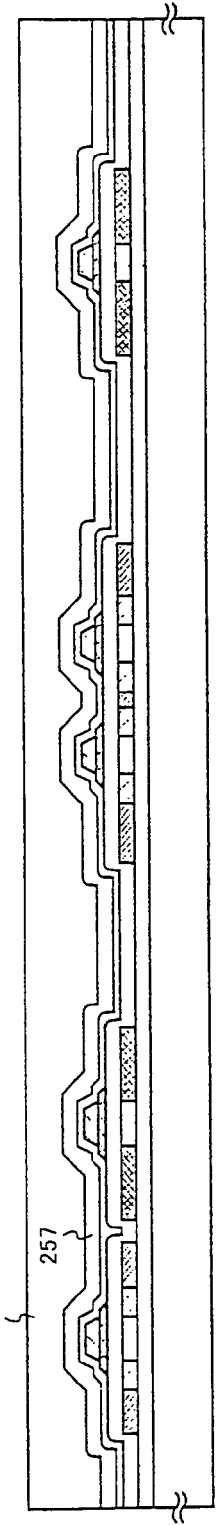

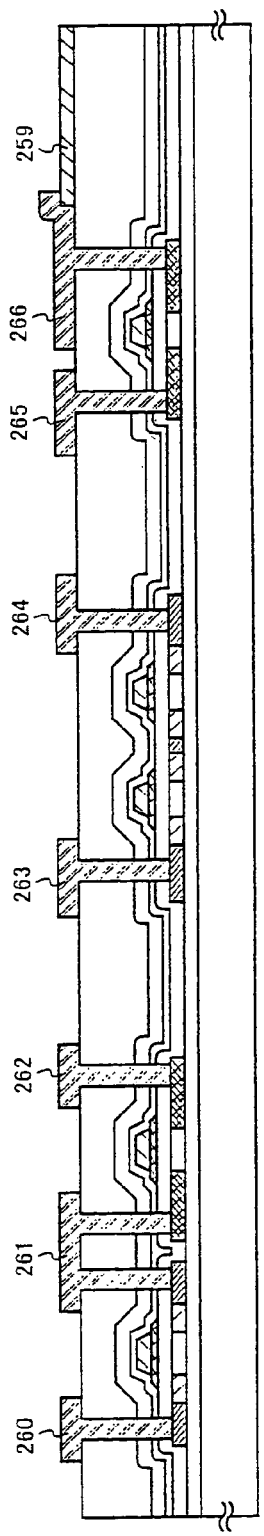
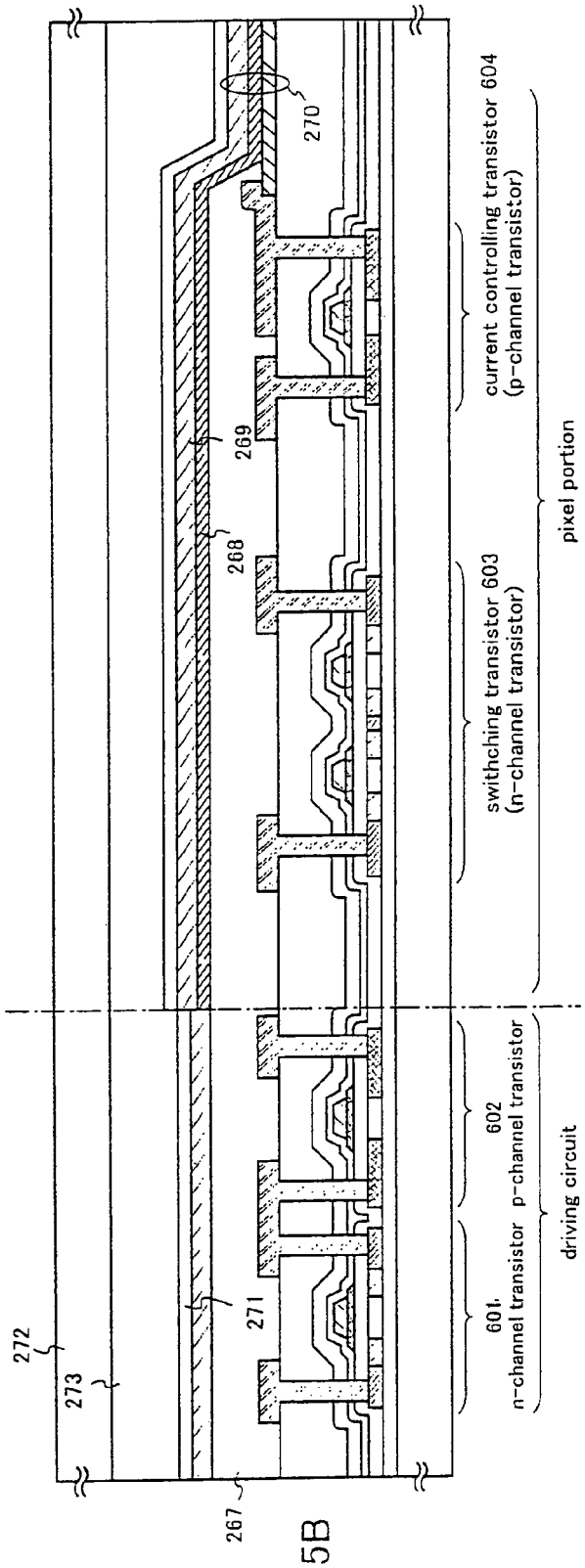
Fig. 5A
Fig. 5B

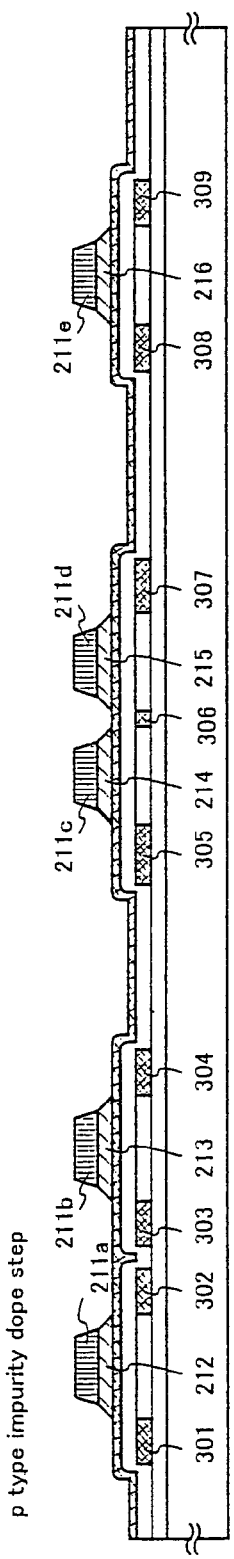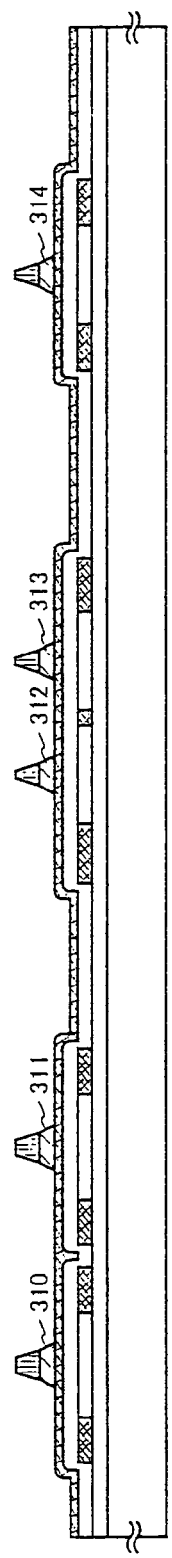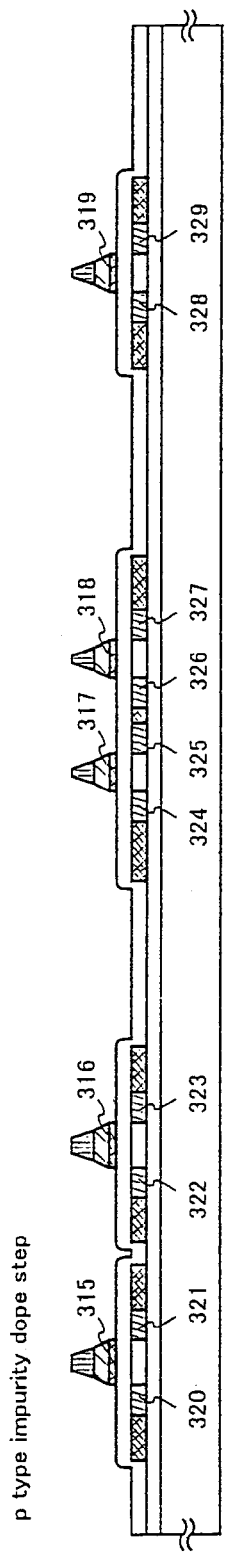

LIGHT EMITTING DEVICE AND IMAGE PLAYBACK DEVICE HAVING TRIPLET AND SINGLET COMPOUNDS IN ELECTROLUMINESCENT LAYER

BACKGROUND OF THE INVENTION

1. Field of the Invention

The present invention relates to a device having an element in which a luminous material is placed between electrodes (hereinafter referred to as light emitting element) (the device will hereafter be called a light emitting device). Specifically, the invention relates to a light emitting device having a light emitting element that employs as the luminous material an organic compound capable of providing EL (electro luminescence) (hereinafter referred to as EL element).

2. Description of the Related Art

In recent years, researches have been advanced on an EL element having a structure in which a thin film formed of an organic compound capable of providing EL (EL layer) is placed between an anode and a cathode, and light emitting devices utilizing the luminous characteristic of the EL element have been developed.

An EL layer usually has a laminate structure typical example of which is one proposed by Tang et al. of Eastman Kodak Company and composed of a hole transporting layer, a light emitting layer, and an electron transporting layer. This structure has so high a light emitting efficiency that it is employed in almost all of EL displays that are under development at present.

Other examples of the laminate structure of the EL layer include a structure in which a hole injection layer, a hole transporting layer, a light emitting layer, and an electron transporting layer are layered on an anode in this order, and a structure in which a hole injection layer, a hole transporting layer, a light emitting layer, an electron transporting layer, and an electron injection layer are layered on an anode in this order. The light emitting layer may be doped with a fluorescent pigment or the like.

In this specification all the layers that are placed between an anode and a cathode are collectively called an EL layer. Therefore the hole injection layer, the hole transporting layer, the light emitting layer, the electron transporting layer, and the electron injection layer mentioned above are all included in the EL layer.

When a given voltage is applied to the EL layer structured as above by a pair of electrodes, recombination of carriers takes place in the light emitting layer to emit light. A light emitting element composed of an anode, an EL layer, and a cathode is called herein an EL element.

In an EL element, degradation of its EL layer is accelerated when a driving voltage is high. Therefore an organic compound emitting Light by a triplet exciton (hereinafter referred to as triplet compound) is sometimes used instead of the usual luminous material, namely, a singlet compound (an organic compound that emits light by singlet exciton), because the triplet compound can emit light of high luminance with a low driving voltage.

The term singlet compound herein refers to a compound that emits light solely through singlet excitation and the term triplet compound herein refers to a compound that emits light through triplet excitation.

The luminance of light emitted from an EL element is controlled by the voltage applied to its EL layer. However, the luminance of emitted light in relation to the applied voltage varies between luminous materials used to form the light emitting layer in the EL layer. To elaborate, a luminous material that emits low luminance light requires application of high voltage if a higher luminance is aimed. Unfortunately, application of high voltage leads to degradation of the luminous material. Furthermore, if EL elements formed on the same substrate receive the same voltage but emit light of varying luminance, different voltages have to be applied in order to make the EL elements to emit light of the same luminance. This results in another problem of varying EL element lifetime.

SUMMARY OF THE INVENTION

The present invention has been made to solve the above problems, and an object of the present invention is to provide a long-Living EL element that can emit Light of desired luminance with a low voltage.

According to the present invention, a plurality of EL elements formed in a pixel portion on the same substrate include EL elements whose EL layers contain luminous materials emitting low luminance light (singlet compound) and EL elements whose EL layers contain triplet compounds capable of emitting high luminance Light with a low voltage. By using the two types of EL elements in a strategically planned combination, the present invention makes it possible to control and equalize the luminance of light emitted from the plural EL elements as well as reduce the power consumption of the EL elements.

FIG. 1A shows a circuit structure of a pixel portion usable in the present invention. Reference symbol 101 denotes a gate wiring line, 102*a* to 102*c*, source wiring lines, and 103*a* to 103*c*, current supplying lines. These wiring lines define three regions in which a pixel a (104*a*), a pixel b (104*b*), and a pixel c (104*c*) are respectively formed.

Denoted by 105 is a switching transistor, which is formed in each of the three pixels. The structure shown here as an example has two channel formation regions between a source region and a drain region. However, the number of channel formation regions may be more than two or only one.

A current controlling transistor is denoted by 106 and is provided in each pixel. The current controlling transistor has a gate connected to one switching transistor, a source connected to one current supplying line, and a drain connected to one EL element. Reference symbol 107 denotes a condenser, which holds a voltage applied to the gate of the current controlling transistor 106. However, the condenser 107 may be omitted.

The pixel a (104*a*), the pixel b (104*b*), and the pixel c (104*c*) have an EL element a (108*a*), an EL element b (108*b*), and an EL element c (108*c*), respectively.

These EL elements have an element structure shown in FIG. 1B. An EL element 111 is composed of a cathode 112, an anode 113, and an EL layer 114. The EL layer 114 emits light when a voltage is applied to the cathode 112 or the anode 113.

The EL layer 114 consists of a plurality of layers including: a light emitting layer 115 formed of a luminous material; an electron injection layer 116 for improved injection of electrons from the cathode; and an electron transporting layer 117 for transporting the injected electrons to the light emitting layer 115. The layers 116 and 117 are sandwiched between the cathode 112 and the light emitting layer 115.

The EL layer also includes a hole injection layer 118 for improved injection of holes from the anode, and a hole transporting layer 119 for transporting the injected holes to the light emitting layer 115. The layers 118 and 119 are sandwiched between the anode 113 and the light emitting layer 115.

Usually, light is emitted through recombination between the electrons injected from the cathode 112 and the holes injected from the anode 113 taking place in the light emitting layer 115. However, the present invention employs a hole transporting layer in order to enhance the luminance of the emitted light. In other words, the invention needs the cathode 112, the anode 113, the light emitting layer 115, and the hole transporting layer but other layers except for the hole transporting layer are provided only when necessary.

The present invention uses two types of EL elements; one has a triplet compound in the light emitting layer 115 of the EL layer 114 shown in FIG. 1B and the other has a singlet compound in its light emitting layer. The two types of EL elements are combined and formed in each of the pixels a to c (104a to 104c) shown in FIG. 1A, so that the luminance of light emitted from the plural EL elements is equalized and a lopsided degradation in which some EL elements degrade faster than other EL elements is prevented.

When three color pixel display is intended, for example, if the luminance of light emitted from a luminous material for lighting the pixel a (104a) in one color is lower than the luminance of light of other two colors for respectively lighting the pixel b (104b) and the pixel c (104c), a triplet compound is used in the light emitting layer of the EL element a (108a) while singlet compounds are used in the light emitting layers of the EL elements b and c (108b and 108c).

If the luminance of light of two colors for respectively lighting the pixel a (104a) and the pixel b (104b) is lower than the luminance of light of one color for lighting the pixel c (104c), triplet compounds are used in the light emitting layers of the EL element a (108a) and the EL element b (108b) while a singlet compound is used in the light emitting layer of the EL element c (108c).

If the luminance of emitted light is low in all of three pixels a, b, and c (104a, 104b, and 104c) and higher luminance is wanted to be obtained with a lower voltage, a triplet compound is used in every light emitting layer of the three EL elements a, b, and c (108a, 108b, and 108c).

Materials given as typical triplet compounds are organic compounds described in the following articles:

(1) T. Tsutsui, C. Adachi, S. Saito, Photochemical Processes in Organized Molecular Systems, ed. K. Honda, (Elsevier Sci. Pub., Tokyo, 1991) p. 437.

(2) M. A. Baldo, D. F. O'Brien, Y. You, A. Shoustikov, S. Sibley, M. E. Thompson, S. R. Forrest, Nature 395 (1998), p. 151.

(3) M. A. Baldo, S. Lamansky, P. E. Burrows, M. E. Thompson, S. R. Forrest, Appl. Phys. Lett., 75 (1999) p. 4.

(4) T. Tsutsui, M. J. Yang, M. Yahiro, K Nakamura, T. Watanabe, T. Tsuji, Y. Fukuda, T. Wakimoto, S. Mayaguchi, Jpn. Appl. Phys., 38 (12B) (1999) L1502.

Other than the luminous materials described in the articles above, ones 20 (specifically, metal complexes or organic compounds) expressed by the following molecular formulae may also be used:

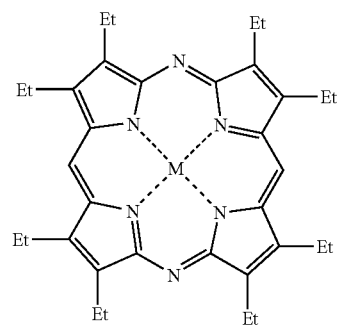

Chemical Formula 1

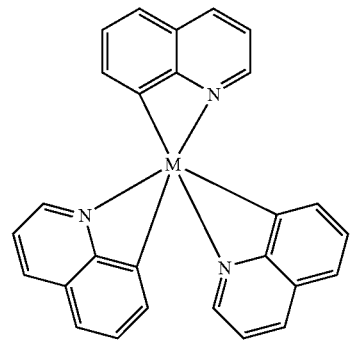

Chemical Formula 2

In the above chemical formulae, M represents an element belonging to Groups 8 to 10 in the periodic table and n represents 2 or 3. Platinum or iridium is used in the articles above. Nickel, cobalt, or palladium is preferable because its physical characteristics are similar to those of platinum or iridium. Nickel is particularly preferable as a central metal, for it easily forms a complex.

Still another material usable as the triplet compound is a rare earth complex which is formed by an ion of a rare earth element, such as europium, terbium, or cerium and from a ligand.

The triplet compound has a higher light emission efficiency than the singlet compound and hence needs lower operation voltage (a voltage required to cause an EL element to emit light) in emitting light of the same luminance.

Furthermore, the present invention improves the mobility of carriers (electrons and holes) injected from an anode by providing a plurality of hole transporting layers between the anode and a light emitting layer 125 as shown in FIGS. 2B and 2C. Although shown in this specification is a case of making only the transporting layer a laminate, the electron transporting layer may also be a laminate similar to the hole transporting layer. In this case, a layer formed of a compound that can reduce the difference in energy level (LUMO level) is placed between the cathode and the electron transporting layer.

FIG. 2A shows an EL element structure similar to the one shown in FIG. 1B. The light emitting layer 125 is placed between a cathode 123 and an anode 124. An electron injection layer 126 and an electron transporting layer 127 are placed between the cathode 123 and the light emitting layer 125. A hole injection layer 128 and a hole transporting layer 1 (129) are placed between the anode 124 and the light emitting layer 125.

In contrast to this, FIG. 2B shows a laminate structure in which one more layer namely, a hole transporting layer 2 (130) is added between the hole transporting layer 1 (129) and the hole injection layer 128.

The laminate structure is translated into a band structure of FIG. 2C. Reference symbols used in FIG. 2C are identical with those in FIGS. 2A and 2B. By the laminate structure formed forming the hole transporting layer 2 (130) between the hole transporting layer 1 (129) and the hole injection layer 128 the difference in HOMO level between the hole injection layer and the hole transporting layer can be reduced. This facilitates movement of holes from the hole injection layer to the hole transporting Layer, and the EL element can have a high luminance with a low voltage as a result.

The case shown here as an example has a laminate structure consisting of the hole transporting layer 1 (129) and the hole transporting layer 2 (130). However, the laminate structure of the hole transporting layer may have two or more layers formed of different materials if the difference in HOMO level between the hole injection layer and the hole transporting layer is reduced as mentioned above. Preferably, the laminate structure has two to five layers.

BRIEF DESCRIPTION OF THE DRAWINGS

In the accompanying drawings:

FIGS. 2A to 2C are diagrams illustrating a laminate structure of an EL element;

FIGS. 4A to 4D are diagrams showing a process of manufacturing a light emitting device;

FIGS. 5A and 5B are diagrams showing a process of manufacturing a light emitting device;

FIGS. 17A to 17C are diagrams showing a process of manufacturing a light emitting device;

DETAILED DESCRIPTION OF THE PREFERRED EMBODIMENTS

Modes for carrying out the present invention will be described in detail through the following embodiments.

Embodiment 1

In this embodiment, a description will be given of a method of manufacturing a pixel portion and a driving circuit provided at its periphery on the same insulator. However, for simplification of the description, with respect to the driving circuit, a CMOS circuit in which an n-channel transistor and a p-channel transistor are combined will be shown.

Figure 1A:
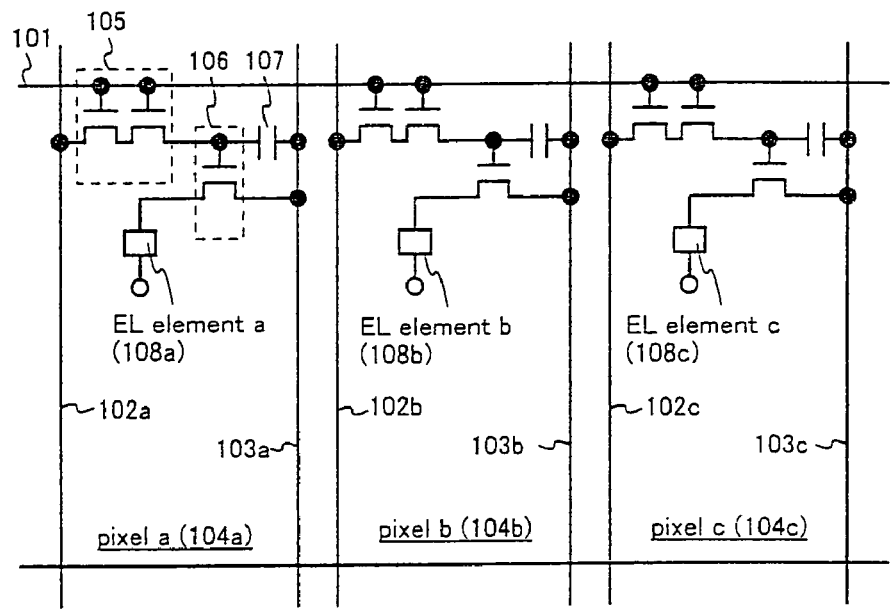
FIGS. 1A and 1B are diagrams illustrating a light emitting device.
Figure 1B:
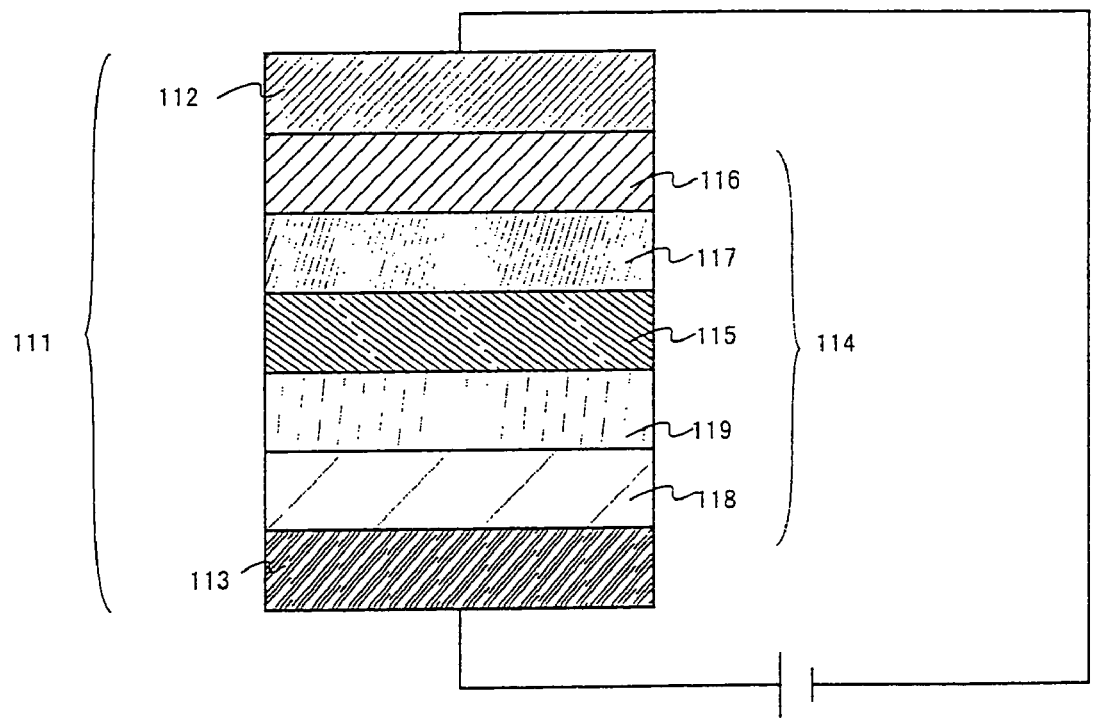
Figure 3A:
FIGS. 3A to 3E are diagrams showing a process of manufacturing a light emitting device.

First, as shown in FIG. 3A, a glass substrate 201 is prepared as a insulator. In this embodiment, not-shown protection films (carbon films, specifically diamond-like carbon films) are provided on both surfaces (the front surface and the rear surface) of the glass substrate 201. As long as it is transparent to visible light, a material other than glass (for example, plastic) may be used.

Next, an base film 202 having a thickness of 300 nm is formed on the glass substrate 201. In this embodiment, as the base film 202, silicon oxynitride films are laminated and are used. At this time, it is appropriate that the concentration of nitrogen of a layer adjacent to the glass substrate 201 is made 10 to 25 wt %, and nitrogen is made to be contained at the concentration rather higher than that of another layer.

Next, an amorphous silicon film (not shown) having a thickness of 50 nm is formed on the base film 202 by a sputtering method. Note that, it is not necessary to limit the film to the amorphous silicon film, but any semiconductor films (including a microcrystalline semiconductor film) containing amorphous structure may be used. As the amorphous semiconductor film, an amorphous silicon film or an amorphous silicon germanium film (a silicon film containing germanium at a concentration of $1 \times 10^{18}$ to $1 \times 10^{21}$ atoms/cm$^3$) may be used. The film thickness may be 20 to 100 nm.

Then, crystallization of the amorphous silicon film is performed by using a well-known laser crystallizing method, and a crystalline silicon film 203 is formed. In this embodiment, although a solid laser (specifically, second harmonic of Nd:YAG laser) is used, an excimer laser may also be used. As the crystallizing method, a furnace annealing method may be used.

Figure 3B:
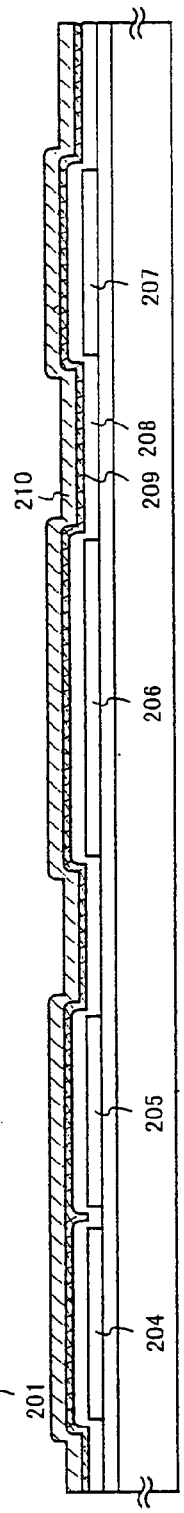

Next, as shown in FIG. 3B, the crystalline silicon film 203 is etched by a first photolithography step to form island-like crystalline silicon films 204 to 207. These are crystalline silicon films which subsequently become the active layers of transistors.

Note that, in this embodiment, although the crystalline silicon films are used as the active layers of the transistors, an amorphous silicon film can also be used as the active layer.

Here, in this embodiment, a protection film (not shown) made of a silicon oxide film and having a thickness of 130 nm is formed on the island-like crystalline silicon films 204 to 207 by a sputtering method, and an impurity element (hereinafter referred to as a p-type impurity element) to make a semiconductor a p-type semiconductor is added to the island-like crystalline silicon films 204 to 207. As the p-type impurity element, an element (typically, boron or gallium) belonging to group 13 of the periodic table can be used. Note that, this protection film is provided to prevent the crystalline silicon film from directly being exposed to plasma when the impurity is added, and to enable fine concentration control.

The concentration of the p-type impurity element added at this time may be made $1 \times 10^{15}$ to $5 \times 10^{17}$ atoms/cm$^3$ (typically, $1 \times 10^{16}$ to $1 \times 10^{17}$ atoms/cm$^3$). The p-type impurity element added at this concentration is used to adjust the threshold voltage of the n-channel transistor.

Next, the surfaces of the island-like crystalline silicon films 204 to 207 are washed. First, the surface is washed by using pure water containing ozone. At that time, since a thin oxide film is formed on the surface, the thin oxide film is removed by using a hydrofluoric acid solution diluted to 1%. By this treatment, contaminants adhered to the surfaces of the island-like crystalline silicon films 204 to 207 can be removed. At this time, it is preferable that the concentration of ozone is 6 mg/L or more. The series of treatments are carried out without opening to the air.

Then, a gate insulating film 208 is formed to cover the island-like crystalline silicon films 204 to 207. As the gate insulating film 208, an insulating film having a thickness of 10 to 150 nm, preferably 50 to 100 nm and containing silicon may be used. This may have a single-layer structure or a laminate structure. In this embodiment a silicon oxynitride film having a thickness of 80 nm is used.

In this embodiment, the steps from the surface washing of the island-like crystalline silicon films 204 to 207 to the formation of the gate insulating film 208 are carried out without opening to the air, so that contaminants and interface levels on the interface between the semiconductor film and the gate insulating film are lowered. In this case, a device of a multi-chamber system (or an inline system) including at least a washing chamber and a sputtering chamber may be used.

Next, a tantalum nitride film having a thickness of 30 nm is formed as a first conductive film 209, and further, a tungsten film having a thickness of 370 nm is formed as a second conductive film 210. In addition, a combination of a tungsten film as the first conductive film and an aluminum alloy film as the second conductive film, or a combination of a titanium film as the first conductive film and a tungsten film as the second conductive film may be used.

These metal films may be formed by a sputtering method. When an inert gas such as Xe or Ne is added as a sputtering gas, film peeling due to stress can be prevented. When the purity of a tungsten target is made 99.9999%, a low resistance tungsten film having a resistivity of 20 mΩcm or less can be formed.

Besides, the steps from the surface washing of the semiconductors 204 to 207 to the formation of the second conductive film 210 can also be carried out without opening to the air. In this case, a device of a multi-chamber system (or an inline system) including at least a washing chamber, a sputtering chamber for forming an insulating film, and a sputtering chamber for forming a conductive film may be used.

Next, the resist 211a to 211e is formed and the second conductive film 210 is etched. As an etching condition, it is preferable to perform a dry etching using ICP (Inductively Coupled Plasma). As an etching gas, a mixture gas of a carbon tetrafluoride (CF$_4$) gas, a chlorine (Cl$_2$) gas and an oxygen (O$_2$) gas is used.

Figure 3C:
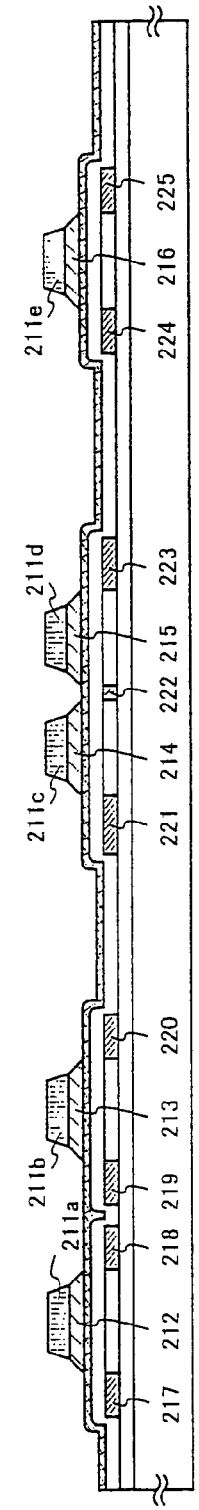

As a typical etching condition, a gas pressure is made 1 Pa, and in this state, RF electric power (13.56 MHz) of 500 W is applied to a coil type electrode to produce plasma. Besides, RF electric power (13.56 MHz) of 150 W is applied as a self bias voltage to a stage on which the substrate is put, so that a negative self bias is applied to the substrate. At this time, it is appropriate that the amount of the flow of the respective gases is made such that the carbon tetrafluoride gas has a flow of $2.5 \times 10^{-5}$ m$^3$/min, the chlorine gas has a flow of $2.5 \times 10^{-5}$ m$^3$/min, and the oxygen gas has a flow of $1.0 \times 10^{-5}$ m$^3$/min. (FIG. 3C)

By this, the second conductive film (tungsten film) 210 is selectively etched, and electrodes 212 to 216 made of the second conductive film are formed. The reason why the second conductive film 210 is selectively etched is that the progress of etching of the first conductive film (tantalum nitride film) becomes extremely slow by addition of oxygen to the etching gas.

Note that, here, there is a reason why the first conductive film 209 is made to remain. Although the first conductive film can also be etched at this time, if the first conductive film is etched, the gate insulating film 208 is also etched in the same step and the film thickness is decreased. At this time, if the thickness of the gate insulating film 208 is 100 nm or more, there is no problem. However, if the thickness is less than that, a part of the gate insulating film 208 is removed in a subsequent step and the semiconductor film thereunder is exposed, and there is a possibility that the semiconductor film which becomes a source region or a drain region of a transistor is also removed.

However, the foregoing problem can be solved by leaving the first conductive film 209 as in this embodiment.

Next, an n-type impurity element (in this embodiment, phosphorus) is added in a self-aligning manner by using the resists 211a to 211e and the electrodes 212 to 216. At this time, phosphorus passes through the first conductive film 209 is added. Impurity regions 217 to 225 formed in this way contain the n-type impurity element at a concentration of $1 \times 10^{20}$ to $1 \times 10^{21}$ atoms/cm$^3$ (typically, $2 \times 10^{20}$ to $5 \times 10^{21}$ atoms/cm$^3$).

Figure 3D:
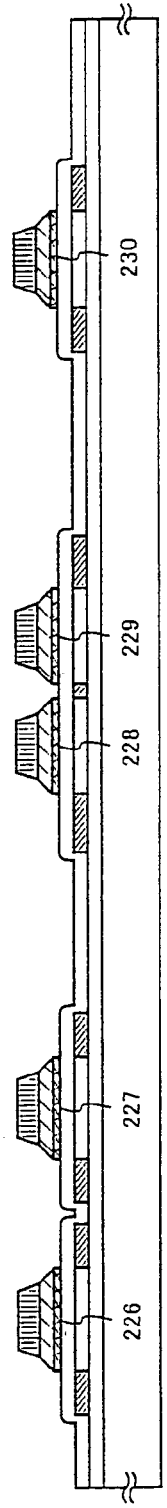

Next, the first conductive film 209 is etched using a resists 211a to 211e as masks. This etching is performed by a dry etching method using the ICP, and a mixture gas of a carbon tetrafluoride (CF$_4$) gas and a chlorine (Cl$_2$) gas is used as an etching gas. A typical etching condition is such that a gas pressure is made 1 Pa, and RF electric power (13.56 MHz) of 500 W is applied to a coil type electrode to produce plasma in this state. Besides, RF electric power (13.56 MHz) of 20 W is applied as a self bias voltage to the stage on which the substrate is put, so that a negative self bias is applied to the substrate. At this time, it is appropriate that the flow of the respective gases is made such that the carbon tetrafluoride gas has a flow of $3.0 \times 10^{-5}$ m$^3$/min, and the chlorine gas has a flow of $3.0 \times 10^{-5}$ m$^3$/min. Thus, the electrodes 226 to 230 from the first conductive film are formed. (FIG. 3D)

Figure 3E:
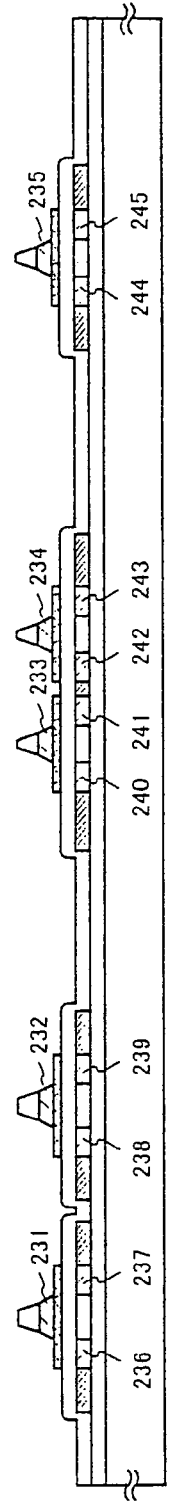

Next, as shown in FIG. 3E, the electrodes 212 to 216 from the second conductive film is etched selectively using the resists 211a to 211e. This etching is performed by a dry etching method using the ICP, and a mixture gas of a carbon tetrafluoride ($CF_4$) gas, a chlorine ($Cl_2$) gas and an oxygen ($O_2$) gas is used as an etching gas. A typical etching condition is such that a gas pressure is made 1 Pa, and in this state, RF electric power (13.56 MHz) of 500 W is applied to a coil type electrode to produce plasma. Besides, RF electric power (13.56 MHz) of 20 W is applied as a self bias voltage to the stage on which the substrate is put, so that a negative self bias is applied to the substrate. At this time, it is appropriate that the amount of the flow of the respective gases is made such that the carbon tetrafluoride gas has a flow of $2.5 \times 10^{-5}$ m$^3$/min, the chlorine gas has a flow of $2.5 \times 10^{-5}$ m$^3$/min, and the oxygen gas has a flow of $1.0 \times 10^{-5}$ m$^3$/min. The etching rate of the tantalum nitride film is suppressed by the existence of oxygen. Thus, the second gate electrodes 231 to 235 are formed.

Next, an n-type impurity element (in this embodiment, phosphorus) is added. In this step, the second gate electrodes 231 to 235 function as masks, and phosphorus passes through part of the electrodes 226 to 230 made of the first conductive film and is added, and n-type impurity regions 236 to 245 containing phosphorus at a concentration of $2 \times 10^{16}$ to $5 \times 10^{19}$ atoms/cm$^3$ (typically, $5 \times 10^{17}$ to $5 \times 10^{18}$ atoms/cm$^3$) are formed.

Besides, as an addition condition here, an acceleration voltage is set quite high as 70 to 120 kV (in this embodiment, 90 kV) so that phosphorus passes through the first conductive film and the gate insulating film and reaches the island-like crystalline silicon films.

Next, as shown in FIG. 4A, the electrodes 226 to 230 made of the first conductive film are etched to form first gate electrodes 246 to 250. This etching is performed by a dry etching method using the ICP or a dry etching method with an RIE (Reactive Ion Etching) mode, and a mixture gas of a carbon tetrafluoride ($CF_4$) gas and a chlorine ($Cl_2$) gas is used as an etching gas. A typical etching condition is such that a gas pressure is made 1 Pa, and RF electric power (13.56 MHz) of 500 W is applied to a coil type electrode to produce plasma in this state. Besides, RF electric power (13.56 MHz) of 20 W is applied as a self bias voltage to the stage on which the substrate is put, so that a negative self bias is applied to the substrate. At this time, it is appropriate that the amount of the flow of the respective gases is made such that the carbon tetrafluoride gas has a flow of $2.5 \times 10^{-5}$ m$^3$/min, the chlorine gas has a flow of $2.5 \times 10^{-5}$ m$^3$/min, and the oxygen gas has a flow of $1.0 \times 10^{-5}$ m$^3$/min.

At this time, the first gate electrodes 246 to 250 are etched so that they partially overlap the n-type impurity regions 236 to 245 through the gate insulating film 208. For example, the n-type impurity region 236 is divided into a region 236a not overlapping the first gate electrode 246 and a region 236b overlapping there through the gate insulating film 208. The n-type impurity region 237 is divided into a region 237a not overlapping the first gate electrode 246 and a region 237b overlapping there through the gate insulating film 208.

Next, resists 251a and 251b are formed, and an impurity element (hereinafter referred to as a p-type impurity element) to make a semiconductor a p-type semiconductor is added. As the p-type impurity element, an element (typically, boron) belonging to group 13 of the periodic table may be added. Here, an acceleration voltage is set so that boron passes through the first gate electrodes 247 and 250 and the gate insulating film 208, and reaches the semiconductor film. In this way, p-type impurity regions 252 to 255 are formed (FIG. 4B).

Next, as shown in FIG. 4C, as a first inorganic insulating film 56, a silicon nitride film or silicon oxynitride film having a thickness of 30 to 100 nm is formed. Thereafter, the added n-type impurity element and p-type impurity element are activated. As an activation means, a furnace annealing, a laser annealing, a lamp annealing, or a combination of those can be used.

Next, as shown in FIG. 4D, a second inorganic insulating film 257 made of a silicon nitride film or a silicon oxynitride film is formed to a thickness of 50 to 200 nm. After the second inorganic insulating film 257 is formed, a heat treatment in the temperature range of 350 to 450° C. is carried out. Note that, it is effective to carry out a plasma treatment using a hydrogen ($H_2$) gas or an ammonia ($NH_3$) gas before the second inorganic insulating film 257 is formed.

Next, as an organic insulating film 258, a resin film transparent to visible light is formed to a thickness of 1 to 2 μm. As the resin film, a polyimide film, a polyamide film, an acryl resin film, or a BCB (benzocyclobutene) film may be used. Besides, a photosensitive resin film can also be used.

Note that, in this embodiment, the laminate film of the first inorganic insulating film 256, the second inorganic insulating film 257, and the organic insulating film 258 is generically called an interlayer insulating film.

Next, as shown in FIG. 5A, a pixel electrode (anode) 259 made of an oxide conductive film which has a large work function and is transparent to visible light is formed to a thickness of 80 to 120 nm on the organic insulating film 258. In this embodiment, an oxide conductive film in which gallium oxide is added to zinc oxide is formed. Besides, as another oxide conductive film, it is also possible to use an oxide conductive film made of indium oxide, zinc oxide, tin oxide, or a compound of combination of those as other oxide conductive film.

Note that, after the oxide conductive film is formed, although patterning is carried out to form the pixel electrode 259, a flattening treatment of the surface of the oxide conductive film can also be carried out before the patterning. The flattening treatment may be a plasma treatment or a CMP (Chemical Mechanical Polishing) treatment.

Next, contact holes are formed in the interlayer insulating film, and wiring lines 260 to 266 are formed. At this time, the wiring line 266 is formed to be connected with the pixel electrode 259. In this embodiment, this wiring line is made as the laminate film of three-layer structure in which a titanium film having a thickness of 150 nm, an aluminum film containing titanium and having a thickness of 300 nm and a titanium film having a thickness of 100 nm are continuously formed from the lower layer side by a sputtering method.

At this time, the wiring lines 260 and 262 function as source wiring lines of a CMOS circuit, and the wiring line 261 functions as a drain wiring line. The wiring line 263 is a source wiring line of a switching transistor, and the wiring line 264 is a drain wiring line of the switching transistor. The wiring line 265 is a source wiring line (equivalent to a current supply line) of a current controlling transistor, and the wiring line 266 is a drain wiring line of the current controlling transistor and is connected with the pixel electrode 259.

Next, as shown in FIG. 5B, a bank 267 is formed. The bank 267 may be formed by patterning an insulating film having a thickness of 100 to 400 nm and containing silicon or an organic resin film. This bank 267 is formed to fill a portion between pixels (between pixel electrodes). Besides, it also has an object to prevent a subsequently formed organic EL film such as a light emitting layer from being brought into direct contact with the end portion of the pixel electrode 259.

Incidentally, since the bank 267 is an insulating film, attention must be paid to electrostatic damage of a device at the time of film formation. When carbon particles or metal particles are added into the insulating film, which becomes a material of the bank 267, to lower its resistivity, the generation of static electricity at the time of film formation can be suppressed. In that case, it is appropriate that the amount of addition of carbon particles or metal particles is adjusted so that the resistivity of the insulating film, which becomes a material of the bank 267, becomes $1\times10^6$ to $1\times10^{12}$ $\Omega$m (preferably, $1\times10^8$ to $1\times10^{10}$ $\Omega$m).

When the carbon particles or the metal particles are added to the bank 267, optical absorption is raised and transmissivity is lowered. That is, since light from the outside of the light emitting device is absorbed, it is possible to avoid such a disadvantage that an outside scene is reflected in the cathode surface of the EL element.

Next, an EL layer 268 is formed by evaporation. In this embodiment, a laminate of a hole injection layer and a light emitting, layer is called an EL layer. An EL layer could be a laminate obtained by combining a light emitting layer with a hole injection layer, a hole transporting layer, a hole blocking layer, an electron transporting layer, and an electron injection layer. As long as the laminate includes a light emitting layer and a hole transporting layer, it fulfills the definition of the EL layer in this specification.

Described here is a method of forming a light emitting layer that emits green light from a triplet compound in the light emitting layer as the EL layer.

A copper phthalocyanine (CuPc) film with a thickness of 20 nm is formed first as a hole injection layer in this embodiment. Then, as a hole transporting layer, MTDATA that is an aromatic amine called star burst amine is deposited to a thickness of 20 nm and $\alpha$-NPD that is also an aromatic amine-based compound is deposited to a thickness of 10 nm. Thus the hole transporting layer described in this embodiment has a two-layer structure of MTDATA and $\alpha$-NPD.

Materials for forming the hole transporting layer are roughly divided into hole transporting low molecular weight compounds and hole transporting high molecular weight compounds. One or more compounds are selected from each of the two types of compounds to form a laminate hole transporting layer. Specifically TPAC, PDA, TPD, and like other compounds can be used as the hole transporting low molecular weight compounds whereas various high polymers having polyvinyl carbazole (PVK) or TPD as their principal chains or side chains can be used as the hole transporting high molecular weight compounds.

The hole transporting layer thus can have layers formed of different materials. However, the total thickness of the hole transporting layer is preferably about 20 to 100 nm. When the layers that constitute the hole transporting layer are increased in number the thickness of the individual layers has to be reduced. Therefore two to four layers are preferable.

Then a light emitting layer is formed from CBP and Ir(ppy)$_3$ by co-evaporation to a thickness of 20 nm. After the light emitting layer is formed, a hole blocking layer is formed from BCP to a thickness of 10 nm and an electron transporting layer is formed from an aluminoquinolilate complex (Alq$_3$) to a thickness of 40 nm.

The case described here is of forming an EL layer that emits green light. Examples of other usable luminous materials emitting green light include an aluminoquinolilate complex (Alq$_3$), which is given in the above as the material of the electron transporting layer, and a beryllium benzoquinolilate complex (BeBq). Also included in the examples is an aluminoquinolilate complex (Alq$_3$) doped with coumarin 6 or quinacridon.

When an EL layer emitting red light is to be formed, examples of the usable luminous material include an Eu complex (Eu(DCM)$_3$ (Phen)) and an aluminoquinolilate complex (Alq$_3$) that is doped with DCM-1.

When an EL layer emitting blue light is to be formed, examples of the usable luminous material include DPVBi that is a distyril derivative, a zinc complex having an azomethine compound as a ligand, and DPVBi doped with perylene.

In carrying out the present invention, the luminous materials given in the above can be used to form EL layers respectively emitting red light green light, and blue light, for example. A singlet compound and a triplet compound can be used in any combination as luminous materials in accordance with the need. Materials introduced in 'Summary of the Invention' may also be used as a triplet compound.

The EL layers respectively emitting red light, green light, and blue light formed here are merely an embodiment. Color of emitted light is not limited thereto and combinations of other colors can be chosen.

After the EL layer 268 is formed, a cathode 269 is formed to a thickness of 300 nm from a conductive film having a small work function. A conductive film containing an element belonging to Group 1 or 2 in the long-period periodic table and a transition element belonging to Groups 3 through 11 can be used as a conductive film having a small work function. This embodiment uses a conductive film formed of ytterbium (Yb). A conductive film formed of a compound of lithium and aluminum may also be used. Thus completed is an EL element 270 including the pixel electrode (anode) 259, the EL layer 268, and the cathode 269.

After the cathode 269 is formed, it is effective to form a passivation film 271 so as to completely cover the EL element 270. The passivation film 271 is a single layer of insulating film or a laminate of a combination of insulating films. Examples of the insulating film include a carbon film, a silicon nitride film, and a silicon oxynitride film.

A preferred passivation film is one that can cover a wide area, and a carbon film especially a DLC (diamond-like carbon) film, is effective. A DLC film can be formed at a temperature range of from room temperature to 100° C., and it is easily be formed above the EL layer 268 that has a low heat resistance. In addition, a DLC film is high in oxygen blocking effect and can prevent oxidization of the EL layer 268. Therefore, oxidization of the EL layer 268 during the subsequent sealing step can be avoided.

A seal (not shown in the drawing) is provided on the substrate 201 (or on the base film 202) so as to surround at least the pixel portion, thereby bonding a covering member 272. The seal may be a UV-curable resin which allows less amount of gas to free and through which moisture and oxygen are hardly transmitted. A gap 273 is filled with inert gas (nitrogen gas or rare gas) or a resin (UV-curable resin or epoxy resin).

It is effective to place a substance having a hygroscopic effect or a substance having an antioxidizing effect in the gap 273. The covering member 272 may be a glass substrate, a metal substrate (preferably a stainless steel substrate), a ceramic substrate, or a plastic substrate (including a plastic film). When a plastic substrate is used, it is preferable to form carbon films (preferably diamond-like carbon films) on the front and back surfaces of the substrate to prevent transmission of oxygen or moisture.

A light emitting device structured as shown in FIG. 5B is thus completed. It is effective to use a film formation apparatus of multi-chamber type or inline type to process steps subsequent to formation of the bank 267 through formation of the passivation film 271 in succession without exposing the device to the air. The successive processing may be further extended to the step of bonding the covering member 272 while avoiding exposure to the air.

Thus formed on the substrate 201 are an n-channel transistor 601, a p-channel transistor 602, a switching transistor (a transistor functioning as a switching element for transferring a video data signal to a pixel) 603, and a current controlling transistor (a transistor functioning as a current controlling element for controlling a current flowing into an EL element) 604.

The driving circuit here includes as a basic circuit a CMOS circuit that combines the n-channel transistor 601 and the p-channel transistor 602 complementarily. The pixel portion is composed of a plurality of pixels each including the switching transistor 603 and the current controlling transistor 604.

Up to this point, the manufacture process has needed the photolithography processing seven times, which is less than in a general active matrix light emitting device. In other words, the process of manufacturing transistors is greatly simplified to improve the yield and reduce the manufacture cost.

Moreover, as explained referring to FIG. 4, by preparing an impurity region that overlaps a first gate electrode with a gate insulating film interposed therebetween, the n-channel transistor can be formed which is strong against degradation due to hot carrier injection. Therefore, a light emitting device of high reliability can be provided.

The light emitting device of this embodiment which has been finished up through the sealing (or enclosing) step for protecting the EL element is further described with reference to FIGS. 6A and 6B. The symbols used in FIGS. 3A to 5B are mentioned when necessary.

Figure 6A:
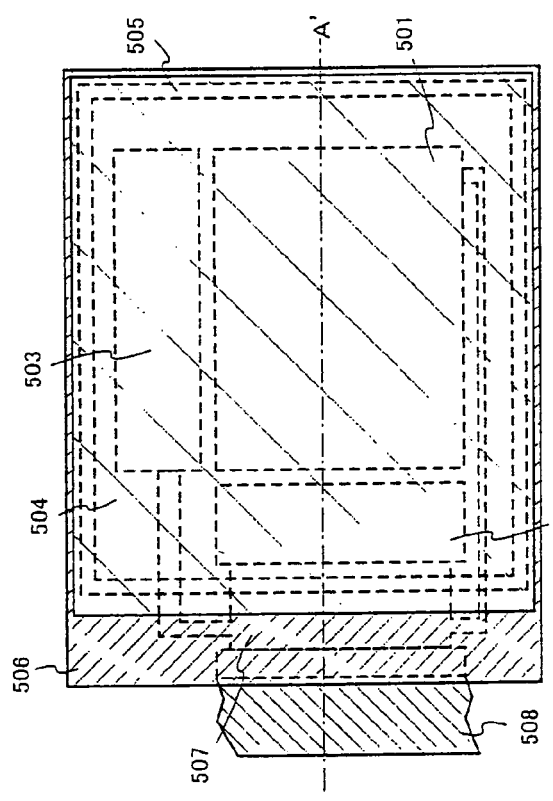
FIGS. 6A and 6B are diagrams respectively showing a top structure of a light emitting device and a sectional structure thereof.
Figure 6B:
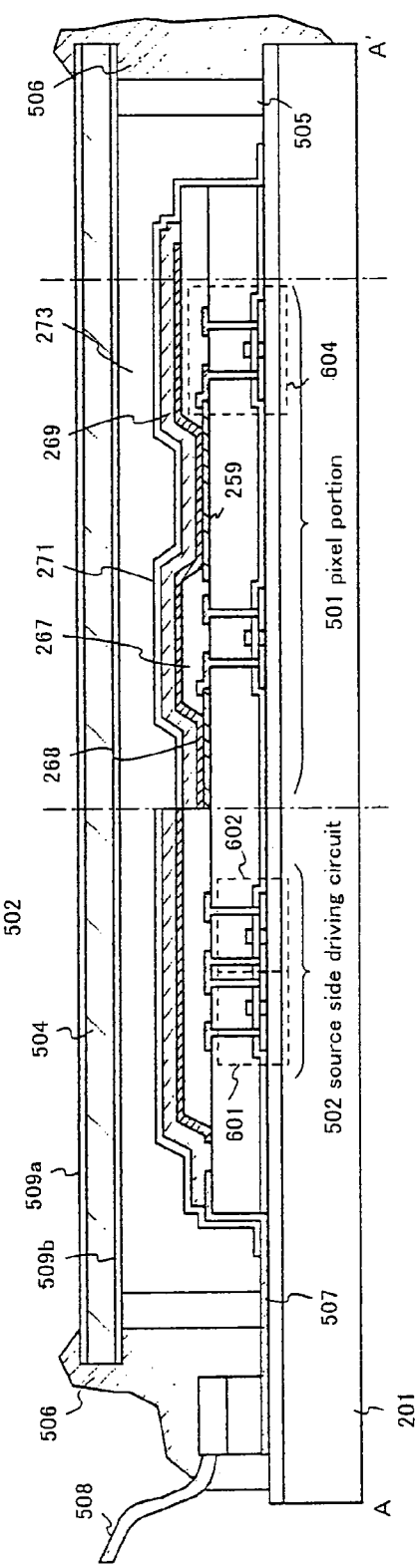

FIG. 6A is a top view showing the device that has been finished up through sealing the EL element, and FIG. 6B is a sectional view taken along the line A-A' in FIG. 6A. An area surrounded by a dotted line and denoted by 501 is a pixel portion, and 502 and 503 represent a source side driving circuit and a gate side driving circuit, respectively. Denoted by 504, 505, and 506 are a covering member, a first seal, and a second seal respectively.

Reference symbol 507 denotes a wiring line for transferring signals to be inputted to the source side driving circuit 502 and the gate side driving circuit 503. The wiring line 508 receives video signals and clock signals from an FPC (flexible printed circuit) 508 that is an external input terminal. Although the FPC alone is shown in FIG. 6A, a printed wiring board (PWB) may be attached to the FPC.

The sectional structure is described next referring to FIG. 6B. The pixel portion 501 and the source side driving circuit 502 are formed over the substrate 201. The pixel portion 501 is composed of a plurality of pixels each including the current controlling transistor 604 and the pixel electrode 259 electrically connected to the drain of the transistor 604. The source side driving circuit 502 is composed of a CMOS circuit that combines the n-channel transistor 601 and the p-channel transistor 602 (see FIG. 5B). A polarizing plate (typically a circular polarizing plate) may be bonded to the substrate 201.

The pixel electrode 259 functions as the anode of the EL element. The bank 267 is formed on each end of the pixel electrode 259. The EL layer 268 is formed on the pixel electrode 259 and the cathode 269 of the EL element is formed on the EL layer. The cathode 269 also functions as a wiring line common to all the pixels, and is electrically connected to the FPC 508 through the connection wiring line 507. All the elements included in the pixel portion 501 and the source side driving circuit 502 are covered with the passivation film 271.

The covering member 504 is bonded by the first seal 505. A spacer may be provided to secure the distance between the covering member 504 and the EL element. The gap 273 is provided inside the first seal 505. The first seal 505 is desirably a material that does not transmit moisture and oxygen. It is effective to place a substance having a hygroscopic effect or a substance having an antioxidizing effect in the gap 273.

On the front and back surfaces of the covering member 504, carbon films (specifically diamond-like carbon films) 509a and 509b each having a thickness of 2 to 30 nm are formed as protective films. The carbon films mechanically protect the surfaces of the covering member 504 as well as prevent permeance of oxygen and moisture.

After the covering member 504 is bonded the second seal 506 is placed so as to cover the exposed surfaces of the first seal 505. The same material may be used for the second seal 506 and the first seal 505.

By enclosing the EL element with the structure as above, the EL element can be shut off from the surroundings completely and external substances that accelerate degradation by oxidization of the EL layer, such as moisture and oxygen, can be prevented from entering the EL element. Accordingly, a light emitting device of high reliability can be obtained.

A light emitting device in which a pixel portion and a driving circuit are on the same substrate and an FPC is attached to the substrate as shown in FIGS. 6A and 6B is specially called a light emitting device with built-in driving circuit in this specification.

The light emitting device manufactured in accordance with this embodiment can operate on both digital signals and analog signals.

Embodiment 2

This embodiment shows characteristics of EL elements having different EL layers that can be used in carrying out the present invention. Structures of the EL layers formed in this embodiment are shown in FIGS. 7A to 7D.

Figure 7D:
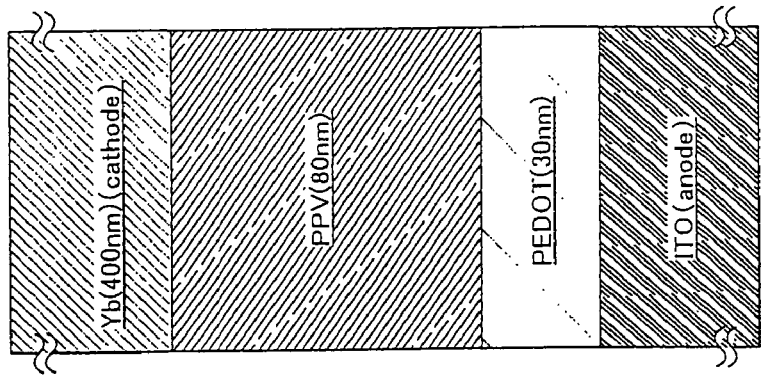
FIGS. 7A to 7D are diagrams showing laminate structures of EL elements.
Figure 7C:
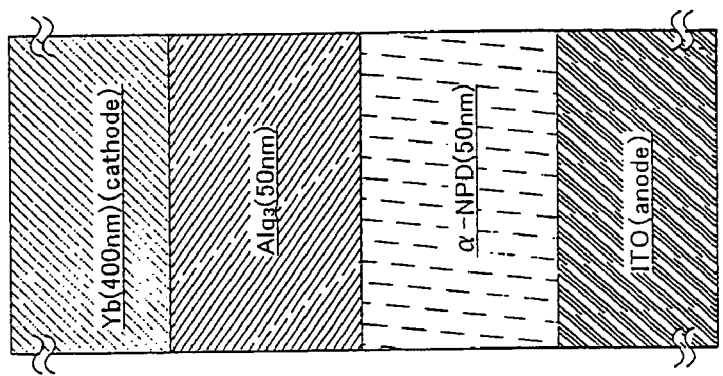
Figure 7B:
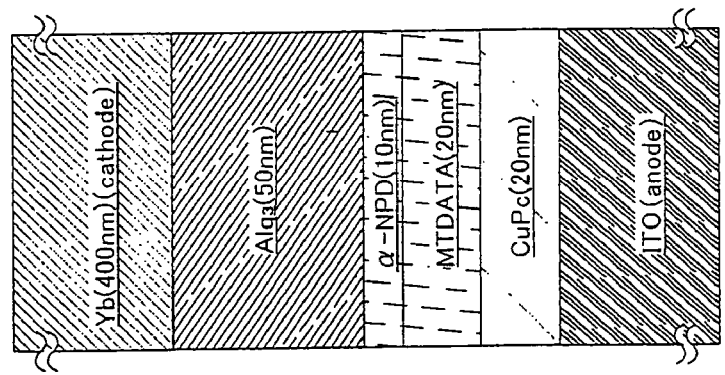
Figure 7A:
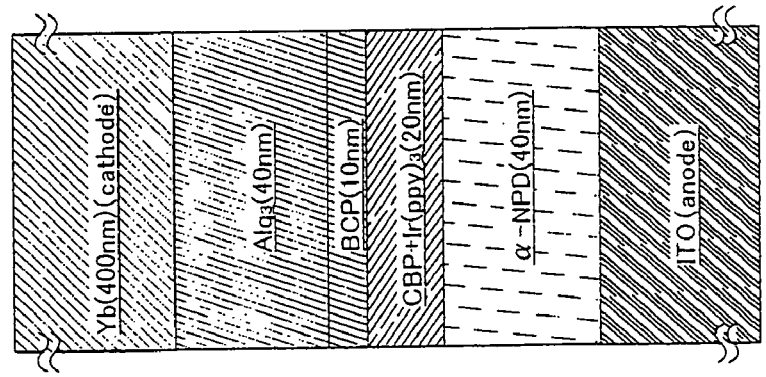

FIG. 7A shows the structure of an EL element a. First, a hole transporting layer is formed from α-NPD by evaporation to a thickness of 40 nm on an anode that is formed of a compound of indium oxide and tin oxide. On the hole transporting layer, a light emitting layer is formed from luminous materials consisting of Ir(ppy)$_3$ and CBP (triplet compounds) by co-evaporation to a thickness of 20 nm. On the light emitting layer, a BCP layer with a thickness of 10 nm and a ALq$_3$ layer with a thickness of 40 nm are formed by evaporation as an electron transporting layer. Then a cathode is formed from Yb to a thickness of 400 nm to complete the EL element a. Light emission from the EL element a utilizes triplet excitation energy by the triplet compounds.

FIG. 7B shows the structure of an EL element b. First, a hole injection layer is formed from copper phthalocyanine by evaporation to a thickness of 20 nm on an anode that is formed of a compound of indium oxide and tin oxide. A hole transporting layer is formed thereon by depositing MTDATA to a thickness of 20 nm and then depositing α-NPD to a thickness of 10 nm by evaporation. On the hole transporting Layer, a light emitting layer is formed from a luminous material consisting of $Alq_3$ (singlet compound) by evaporation to a thickness of 50 nm. Then a cathode is formed from Yb to a thickness of 400 nm to complete the EL element b by evaporation. Light emission from the EL element b utilizes singlet excitation energy by the singlet compound.

FIG. 7C shows the structure of an EL element c. First, a hole transporting layer is formed from α-NPD by evaporation to a thickness of 50 nm on an anode that is formed of a compound of indium oxide and tin oxide. On the hole transporting layer, a light emitting layer is formed from a luminous material consisting of $Alq_3$ (singlet compound) by evaporation to a thickness of 50 nm. Then a cathode is formed from Yb to a thickness of 400 nm to complete the EL element c. Light emission from the EL element c utilizes singlet excitation energy by the singlet compound. The EL layer of the EL element c has no other layers than the light emitting layer and the hole transporting layer.

FIG. 7D shows the structure of an EL element d. First, a hole transporting layer is formed from PEDOT that is a polythiophene derivative by spin coating to a thickness of 30 nm on an anode that is formed of a compound of indium oxide and tin oxide. Polyparaphenylenevinylene (hereinafter referred to as PPV) is then used as a luminous material to form a film with a thickness of 80 nm by spin coating on the hole transporting layer. Then a cathode is formed from Yb to a thickness of 400 nm to complete the EL element d by evaporation. Light emission from the EL element d utilizes singlet excitation energy by the singlet compound. The EL element d is different from the other EL elements a to c in that a high molecular weight material is used for the light emitting layer.

Figure 8A:
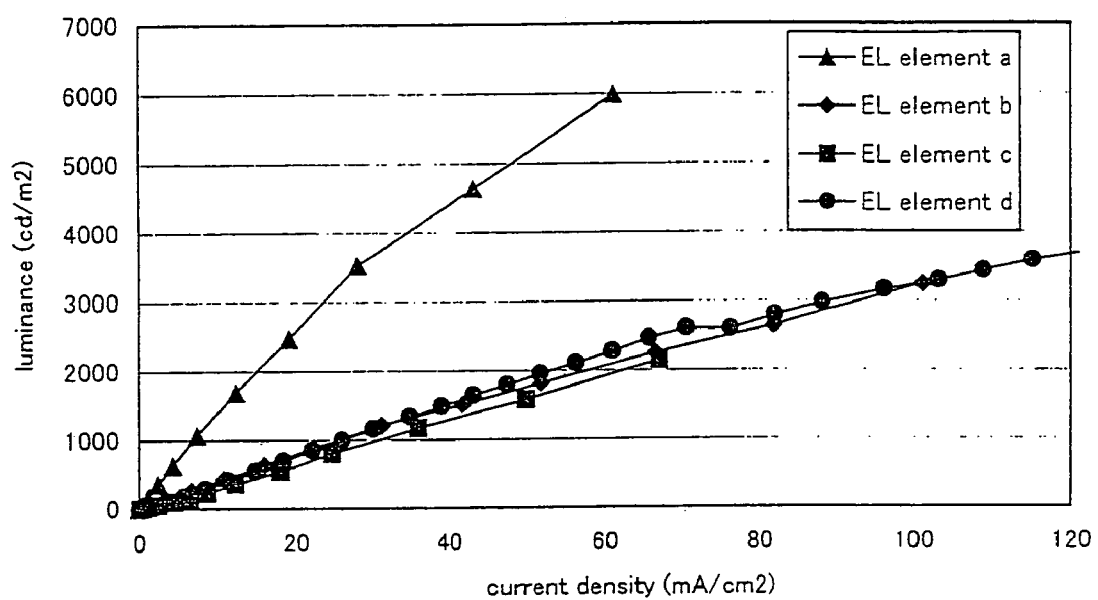
FIGS. 8A and 8B are graphs showing element characteristics of EL elements.
Figure 8B:
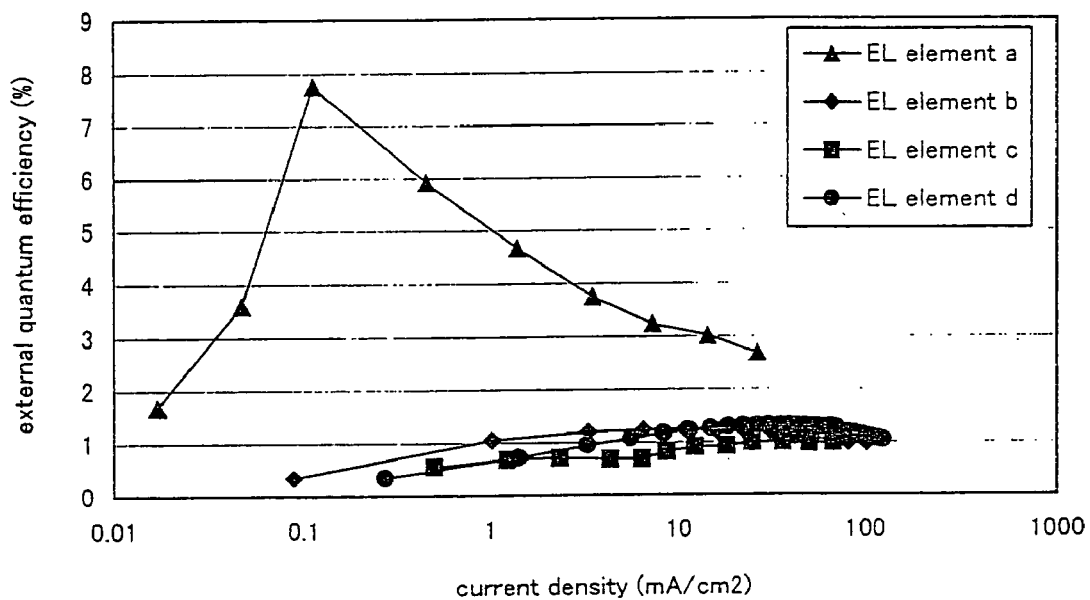

The EL elements illustrated in FIGS. 7A to 7D have been estimated for their electrical characteristics. Results are shown in FIGS. 8A and 8B. FIG. 8A shows the luminance characteristic in relation to the current density rough observation, there is a difference in characteristic in relation to the current density between the EL element that uses triplet compounds and the EL elements that use singlet compounds. To elaborate, when the current density is 60 $mA/cm^2$, the EL element a that uses triplet compounds provides a luminance of about 6000 $cd/m^2$ whereas the EL elements b, c and d that use singlet compounds each provide a luminance of about 2000 $cd/m^2$, namely, one third of the luminance of the EL element a.

FIG. 8B shows results of measuring the external quantum efficiency in relation to the current density. Similar to the case of the luminance characteristic, the EL element a that uses triplet compounds has exhibited a far better external quantum efficiency. The difference in external quantum efficiency between the EL element a and the EL elements b to d is seven times at the maximum.

As shown in the results in FIGS. 8A and 8B, employing a triplet compound in an EL element improves light emission efficiency.

In order to further improve light emission provided by the EL element a of FIG. 7A which uses triplet compounds, another layer is added to the element.

Figure 9C:
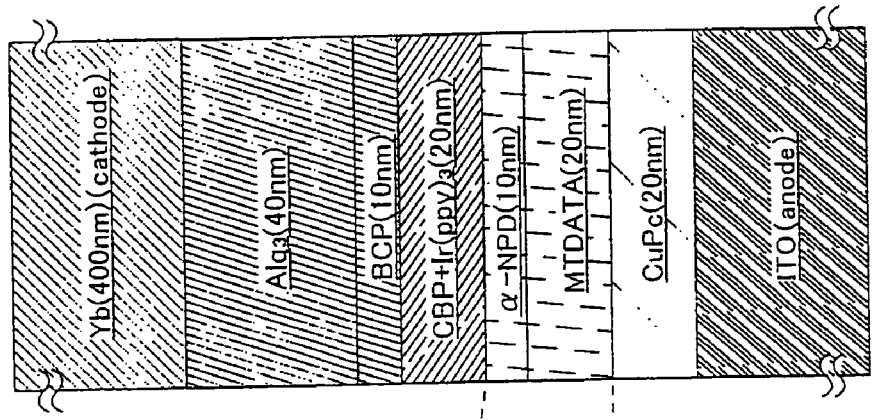
FIGS. 9A to 9C are diagrams showing laminate structures of EL elements.
Figure 9B:
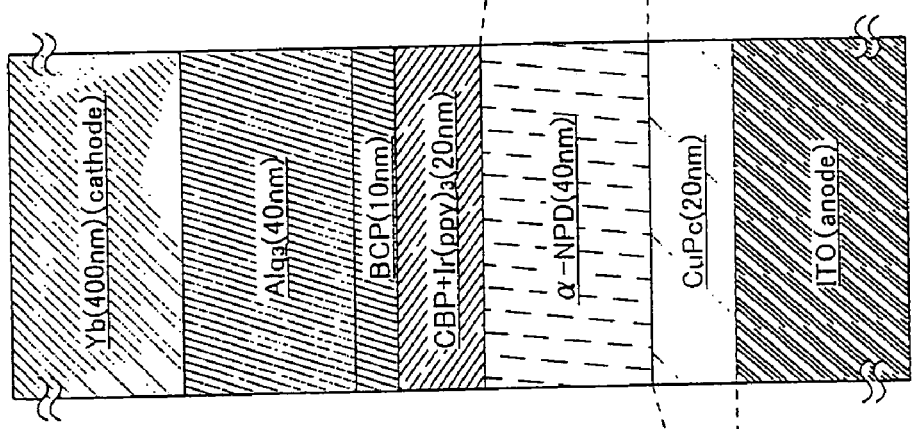
Figure 9A:
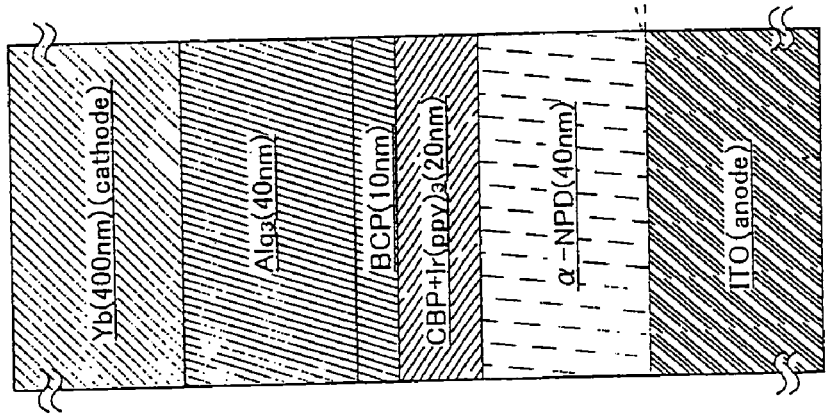
Figure 10A:
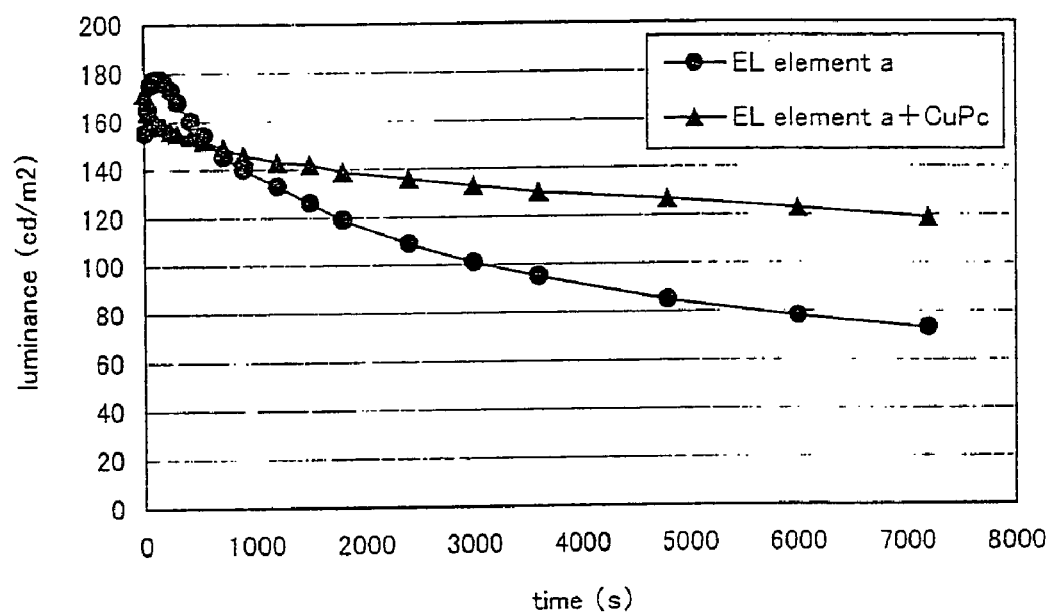
FIGS. 10A and 10B are graphs showing element characteristics of EL elements.
Figure 10B:
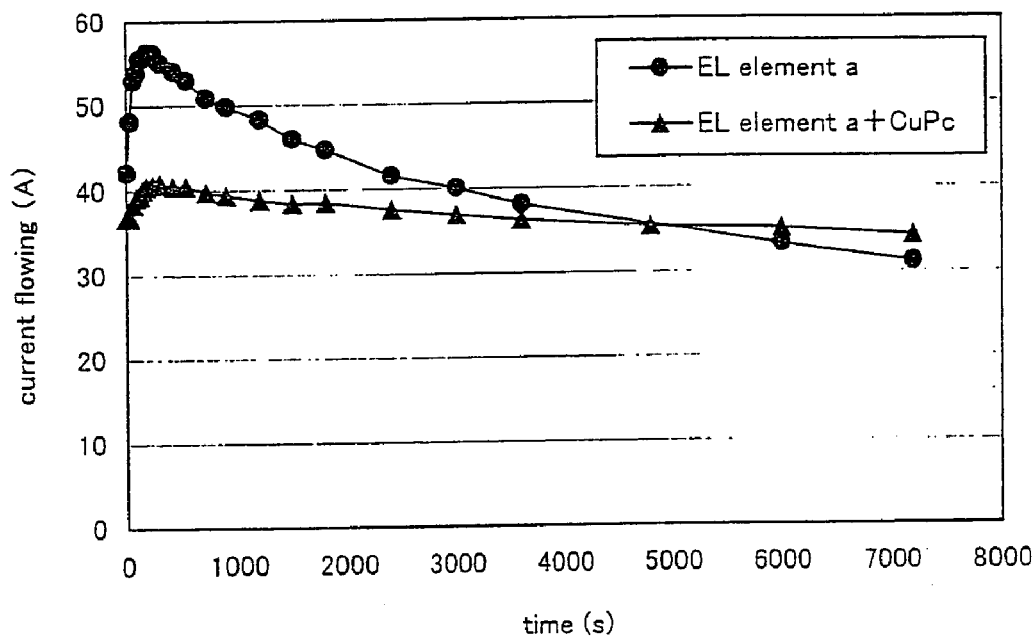

FIG. 9A shows the same EL element a as the one shown in FIG. 7A. In FIG. 9B, copper phthalocyanine is deposited by evaporation to a thickness of 20 nm on the anode of the EL element a. Electric characteristics of this EL element is shown in FIGS. 10A and 10B. As shown in FIG. 10A, providing the copper phthalocyanine layer on the anode does not change the luminance of the EL element itself much but the time during which the luminance is maintained is prolonged.

FIG. 10B shows that the amount of current flowing in an early stage is changed by addition of one more layer but eventually reaches the same value. Therefore, it is clear from FIGS. 10A and 10B that the durability of the EL element when the same amount of current is flown is improved. Although copper phthalocyanine is usually known as a hole injection layer material that improves injection of holes from the anode, it is used here as a material that can improve the durability of the EL element. The results are obtained by measuring a change with time of the luminance of the EL element and a change with time of the amount of current flowing through the EL element when the EL element is continuously lit using a low voltage of 6.5 V. Instead of copper phthalocyanine shown in this embodiment, a polythiophene-based material, for example, PEDOT (poly(3,4-ethylene dioxythiophene)), may be used.

Then an EL element shown in FIG. 9C is fabricated. This EL element has instead of the α-NPD hole transporting layer (40 nm) of FIG. 9B an MTDATA layer with a thickness of 20 nm and an α-NPD layer with a thickness of 10 nm which are formed by evaporation. In short, one more layer is formed between the copper phthalocyanine layer and the hole transporting layer, thereby reducing the energy difference in HOMO level between the two layers. The element in FIG. 9C is referred to as EL element a' in this specification.

Figure 11A:
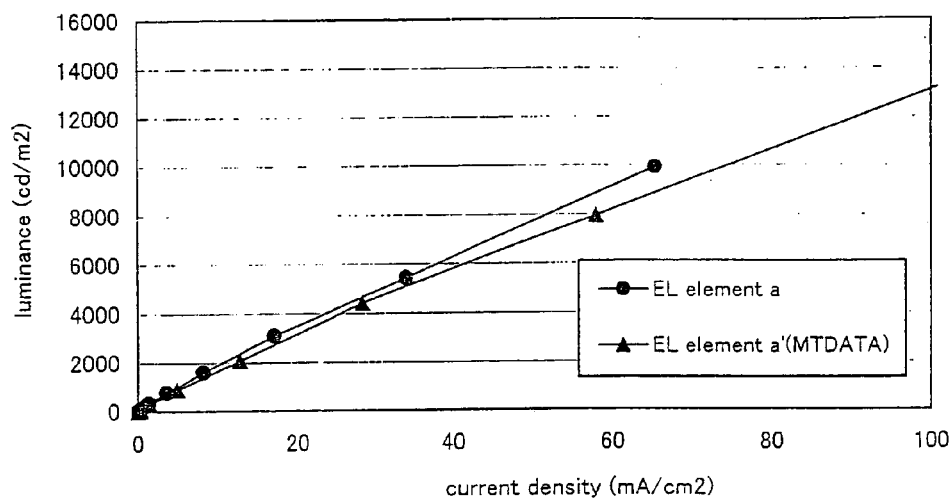
FIGS. 11A to 11C are graphs showing element characteristics of EL elements.
Figure 11B:
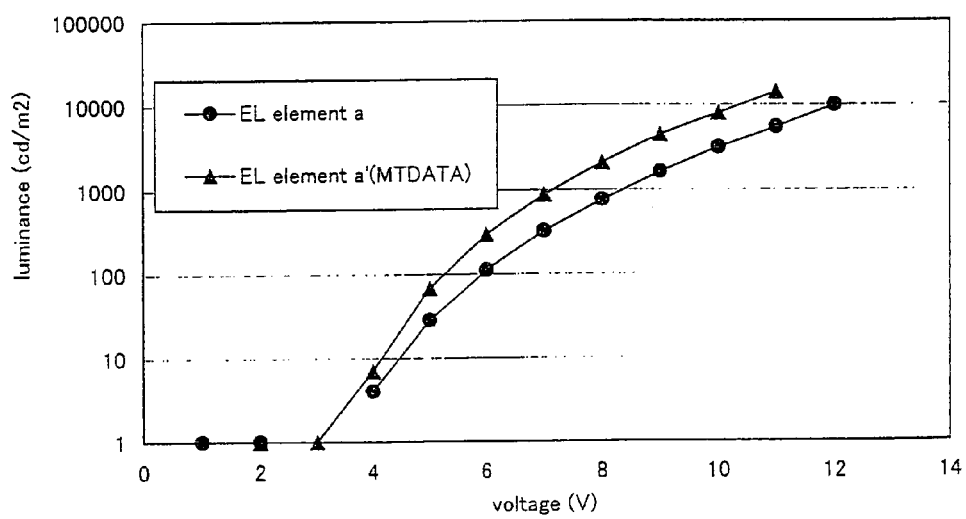
Figure 11C:
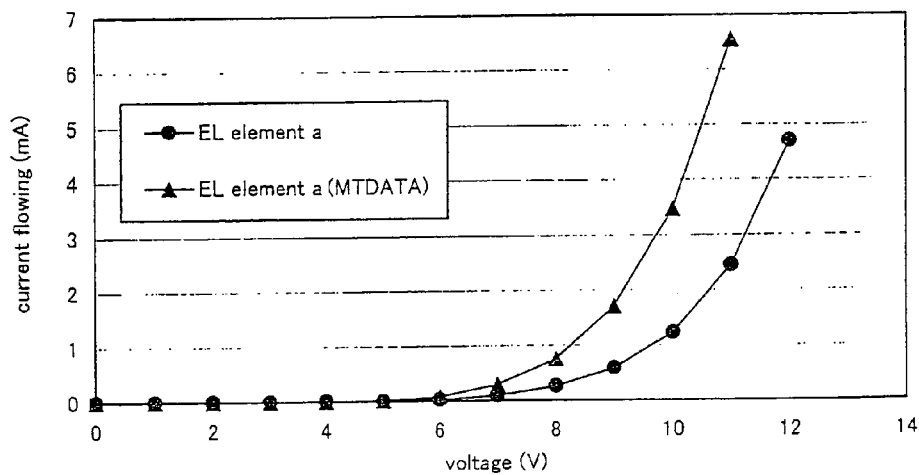

Electrical characteristics of the EL element of FIG. 9C is shown in FIGS. 11A to 11C. FIG. 11A shows results of measuring the luminance of emitted light in relation to the current density. The measurement is made on the EL element a shown in FIG. 9A and the EL element a' obtained by adding, to the EL element a, a hole injection layer formed of copper phthalocyanine and a hole transporting layer formed of MTDATA. From FIG. 11A, it can be seen that the addition of the copper phthalocyanine layer and the MTDATA layer does not influence the luminance of light emitted from the EL element.

FIG. 11B shows results of measuring the luminance of emitted light when a voltage is applied to the EL elements. An improvement is observed in luminance which is brought by the addition of the copper phthalocyanine layer and the MTDATA layer. The fact that a higher luminance is obtained from application of the same voltage means a lower voltage is needed to obtain the same level of luminance.

FIG. 11C shows results of measuring the amount of current when a voltage is applied to the EL elements. When the same voltage is applied, the amount of current flowing is larger in the EL element a' than in the EL element a.

The results above state that the voltage required to drive an EL element is reduced by adding to the EL element a the copper phthalocyanine layer and the MTDATA layer (EL element a').

The EL element a' has been measured also for its response speed.

In the measurement, DC (direct current) is applied by an arbitrary power supply. A period during which the voltage is applied is 'ON' (selected period) whereas a period during which 0 V is applied is 'OFF' (not-selected period), and ON and OFF take turns. Each period lasts 250 μs.

To be specific, estimation is made by using an oscilloscope to read outputs of a photomultiplier set in a microscope. In this measurement, a switching from OFF to ON is defined as rise and a switching from ON to OFF as drop. The rise response time is a time required for the emitted light to reach 90% luminance of full luminance in an optical response that follows switching of the power supply voltage from OFF to ON. On the other hand, the drop response time is a time required for the emitted light to decrease in luminance by 10% of the previous full luminance in an optical response that follows switching of the power supply voltage from ON to OFF.

Figure 25:
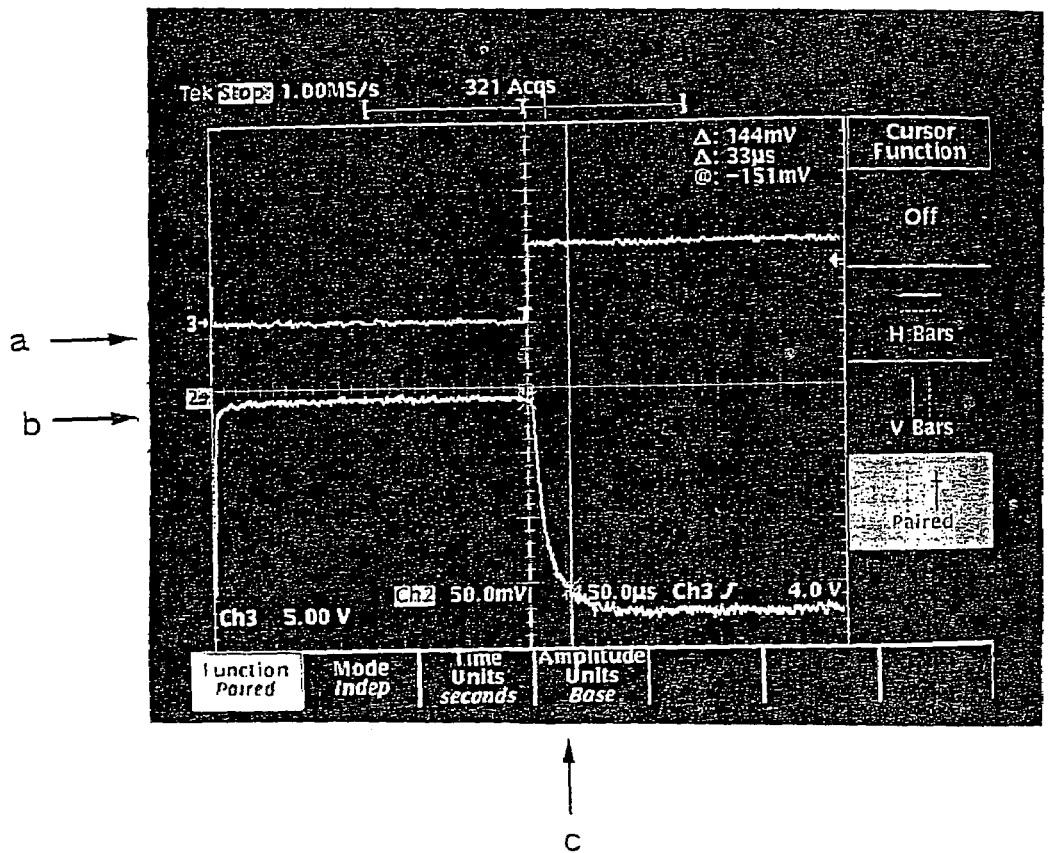
FIG. 25 is a diagram showing element characteristics of an EL element.

The measurement is graphically shown in FIG. 25. In FIG. 25, an arrow a indicates the output (voltage) of the power supply and an arrow b indicates the optical response to the output. The photomultiplier used is of minus output type, and a negative electric potential is therefore outputted when a switching is made from OFF (0 V) to ON (6 V in the example shown here).

An arrow c in FIG. 25 indicates the point at which the luminance reaches 90%. The rise response time at this point is 28 μs. In this embodiment, when the output of the power supply is 6 V, although there are slight fluctuations between the EL elements, the rise response time and the drop response time are both 1 to 100 μs, preferably 1 to 50 μs. Further measurement is made by changing the voltage during ON so that estimation is made for every voltage between 6 V and 10 V. Results thereof (the rise response time and the drop response time) are shown in Table 1.

TABLE 1

| voltage (V) | rise response time (μ s) | drop response time (μ s) |
|---|---|---|
| 6 | 28 | 3 |
| 7 | 6 | 3.24 |
| 8 | 3.5 | 4.2 |
| 9 | 2.36 | 4.04 |
| 10 | 1.64 | 4.52 |

Table 1 shows that the response speed in this voltage range is very high and that the element therefore has no problem also when driven by normal digital driving.

Embodiment 3

Figure 12:
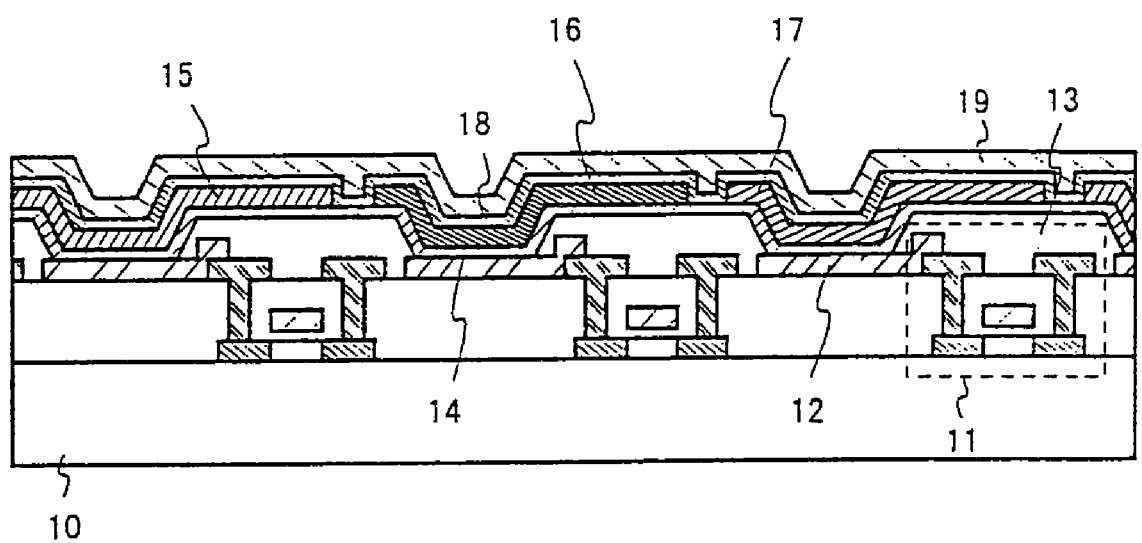
FIG. 12 is a diagram showing a sectional structure of a light emitting device.

FIG. 12 shows a sectional structure of a pixel portion in an active matrix light emitting device of this embodiment. In FIG. 12, reference symbol 10 denotes an insulator, 11, the current controlling transistor (TFT) 604 of FIG. 5B. 12, a pixel electrode (anode), 13, a bank, and 14, a known hole injection layer. Reference symbols 15, 16, and 17 represent a light emitting layer that emits red light, a light emitting layer that emits green light, and a light emitting layer that emits blue light, respectively. Denoted by 18 is a known electron transporting layer, and 19, a cathode.

In this embodiment, triplet compounds are used for the red light emitting layer 15 and the blue light emitting layer 17 whereas a singlet compound is used for the green light emitting layer 16. In other words, an EL element that uses a singlet compound is an EL element that emits green light while EL elements that use triplet compounds are an EL element that emits red light and an EL element that emits blue light.

When a low molecular weight organic compound is used for a light emitting layer, a red light emitting layer and a blue light emitting layer have a lifetime shorter than that of a green light emitting layer under the present circumstances. This is because the red light emitting layer and the blue light emitting layer are inferior in light emission efficiency to the green light emitting layer and hence require higher operation voltage in order to emit light of the same luminance as the green light, to thereby accelerate their degradation that much.

However, the red light emitting layer 15 and the blue light emitting layer 17 in this embodiment use triplet compounds that are high in light emission efficiency and hence it is possible to obtain the same operation voltage as the green light emitting layer 16 in emitting light of the same level of luminance as the layer 16. Accordingly, the red light emitting layer 15 and the blue light emitting layer 17 degrade not so much faster than the green light emitting layer 16, and an image can be displayed in color while avoiding color displacement and like other problems. The lowered operation voltage is also preferable in terms of the margin for the withstand voltage of the transistor because the margin can be set low.

Although the case shown in this embodiment is of using triplet compounds for the red light emitting layer 15 and the blue light emitting layer 17, the green light emitting layer 16 may also be formed of a triplet compound.

Figure 13A:
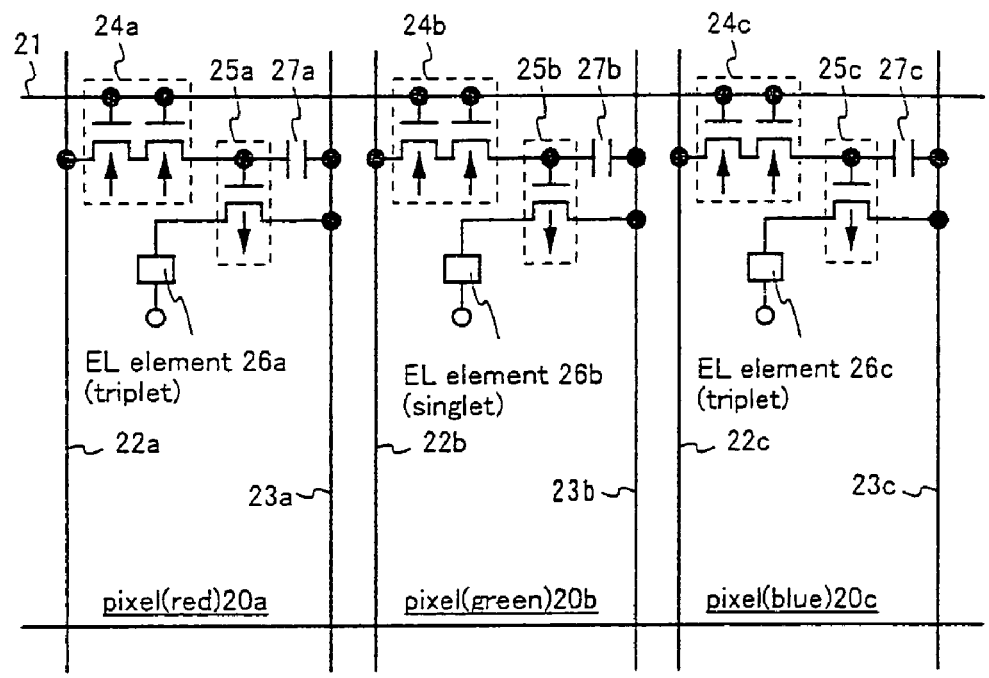
FIGS. 13A and 13B are diagrams showing the circuit structure of pixels in a light emitting device.
Figure 13B:
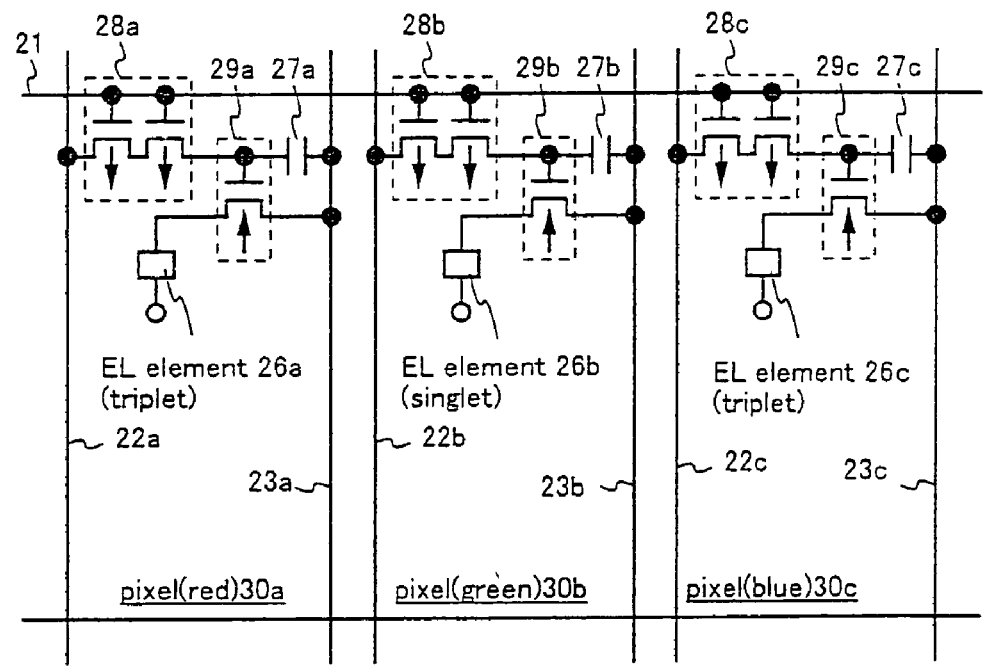

Next, the circuit structure of the pixel portion according to this embodiment is shown in FIGS. 13A and 13B. Shown here are a pixel (pixel (RED)) 20a having an EL element that emits red light, a pixel (pixel (GREEN)) 20b having an EL element that emits green light, and a pixel (pixel (BLUE)) 20c having an EL element that emits blue light. The three pixels have the same circuit structure.

In FIG. 13A, reference symbol 21 denotes a gate wiring line, 22a to 22c, source wiring lines (data wiring lines), and 23a to 23c, current supplying lines. The current supplying lines 23 are wiring lines that determine the operation voltage of the EL elements, and apply the same voltage to the red light emitting pixel 20a, the green light emitting pixel 20b, and the blue light emitting pixel 20c. Accordingly, the wiring lines may be designed to have the same width (thickness).

Denoted by 24a to 24c are switching transistors, which are n-channel transistors in this embodiment. Although shown here as an example is a structure in which two channel formation regions are placed between a source region and a drain region, the number of channel formation regions may be more than two or only one.

Denoted by 25a to 25c are current controlling transistors. A gate of each of the current controlling transistors is connected to one of the switching transistors 24a to 24c, a source thereof is connected to one of the current supplying lines 23a to 23c, and a drain thereof is connected to one of EL elements 26a to 26c. 27a to 27c denote condensers for holding the voltage applied to gates of the current supplying lines 25a to 25c. However, the condensers 27a to 27c may be omitted.

The case shown in FIG. 13A is of using n-channel transistors for the switching transistors 24a to 24c and p-channel transistors for the current controlling transistors 25a to 25c. As shown in FIG. 13B, it is also possible to use p-channel transistors for switching transistors 28a to 28c and n-channel transistors for current controlling transistors 29a to 29c in each of a pixel (RED) 30a, a pixel (GREEN) 30b, and a pixel (BLUE) 30c.

FIGS. 13A and 13B show a case in which two transistors are provided in one pixel. However, the number of transistors may be more than two (typically, three to six). Any combination of n-channel transistors and p-channel transistors may be employed also when more than two transistors are provided in each pixel.

In this embodiment, the EL element 26a is a red light emitting EL element and the EL element 26c is a blue light emitting EL element, and both of them use triplet compounds for their light emitting layers. The EL element 26b is a green light emitting EL element and a singlet compound is used for its light emitting layer.

By choosing between a triplet compound and a singlet compound in this way, the El elements 26a to 26c can have the same operation voltage (10 V or less, preferably 3 to 10V). Thus the power supply required in the light emitting device can uniformly be set to, for example, 3 V or 5 V, to make the circuit design simpler.

The structure of this embodiment may be combined with any of the structures of Embodiments 1 and 2.

Embodiment 4

This embodiment describes a case in which n-channel transistors are used for all of transistors that constitute a pixel portion and a driving circuit. The n-channel transistors are fabricated in accordance with Embodiment 1, and explanations thereof are omitted.

Figure 14:
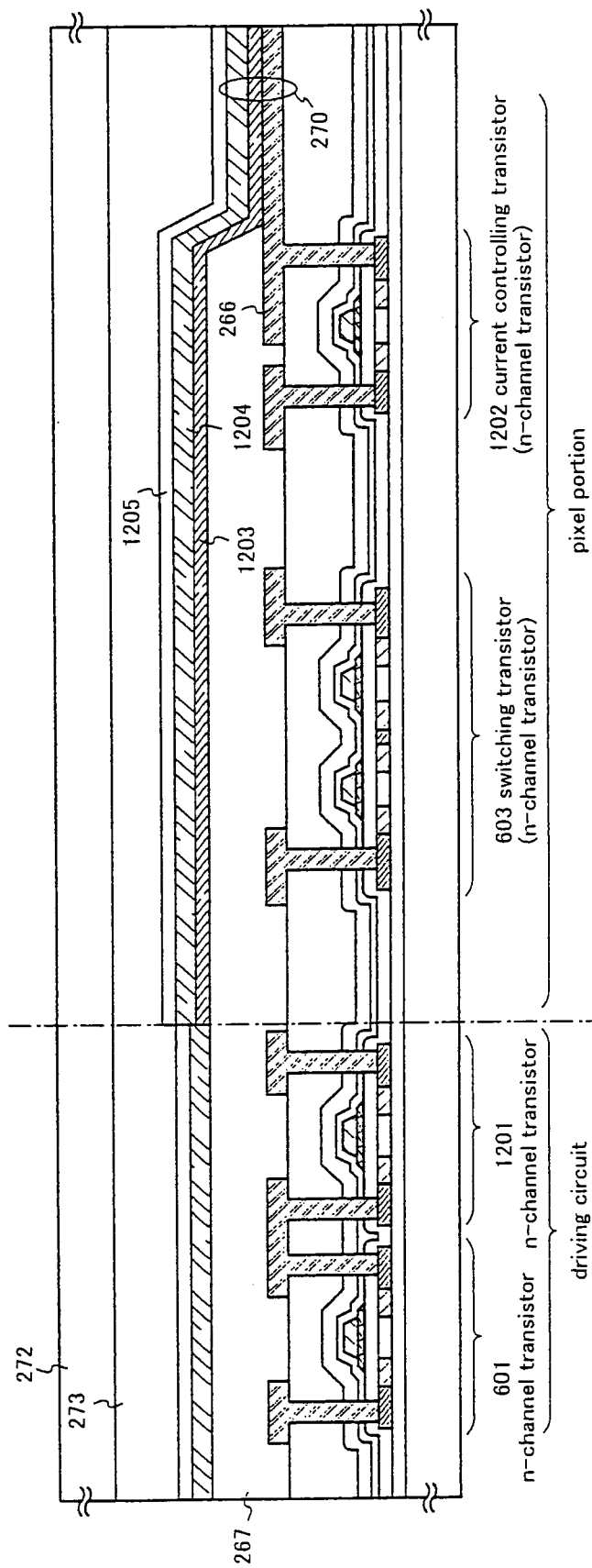
FIG. 14 is a diagram showing a sectional structure of a light emitting device.

The sectional structure of a light emitting device according to this embodiment is shown in FIG. 14. The basic structure thereof is the same as the sectional structure of FIG. 5B which is described in Embodiment 1. Therefore only differences are picked up and explained here.

In this embodiment, an n-channel transistor 1201 is provided instead of the p-channel transistor 602 of FIG. 5B and a current controlling transistor 1202 that is an n-channel transistor is provided in place of the current controlling transistor 604.

A wiring line 266 connected to a drain of the current controlling transistor 1202 functions as a cathode of an EL element. Formed on the wiring line are an EL layer 1203, an anode 1204 formed of an oxide conductive film, and a passivation film 1205. The wiring line 266 is desirably formed from a metal film containing an element belonging to Group 1 or 2 in the periodic table. If not at least a surface of the wiring line 266 that is in contact with the EL layer 1203 is formed of a metal film containing an element belonging to Group 1 or 2 in the periodic table.

The n-channel transistors used in this embodiment may be all enhancement type transistors or depression type transistors. Alternatively, enhancement type transistors and depression type transistors may be used in combination.

Figure 15:
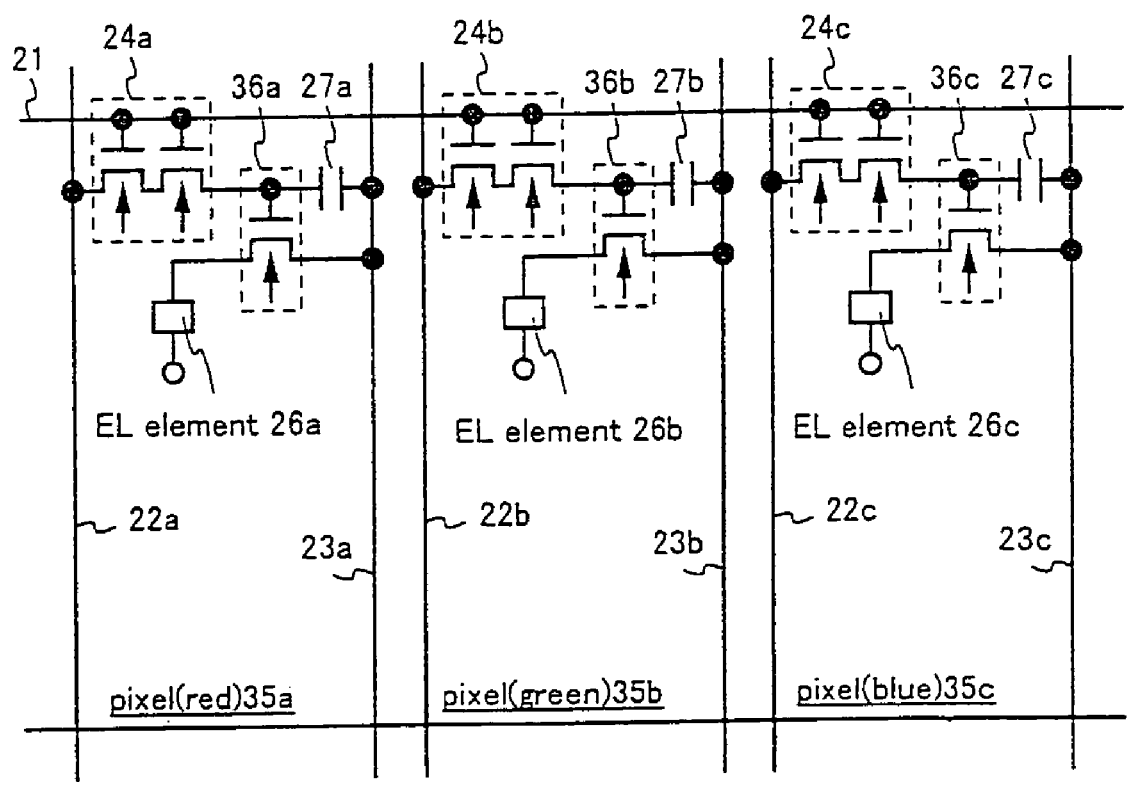
FIG. 15 is a diagram showing the circuit structure of pixels in a light emitting device.

Now, the circuit structure of pixels is shown in FIG. 15. For the parts denoted by the same reference symbols as those in FIGS. 13A and 13B, refer to explanations of FIGS. 13A and 13B.

As shown in FIG. 15, the switching transistors 24a to 24c and the current controlling transistors 36a to 36c provided in a pixel (RED) 35a, a pixel (GREEN) 35b, and a pixel (BLUE) 35c, respectively, are all n-channel transistors.

According to the structure of this embodiment, the photolithography step for forming the p-channel transistors and the photolithography step for forming the pixel electrodes (anodes) in the process of manufacturing a light emitting device of Embodiment 1 corresponding to the photolithography step for forming cathodes in this embodiment are eliminated. Therefore the manufacture process can be simplified even more.

The structure of this embodiment may be combined with any of the structures of Embodiments 1 through 3.

Embodiment 5

Figure 16:
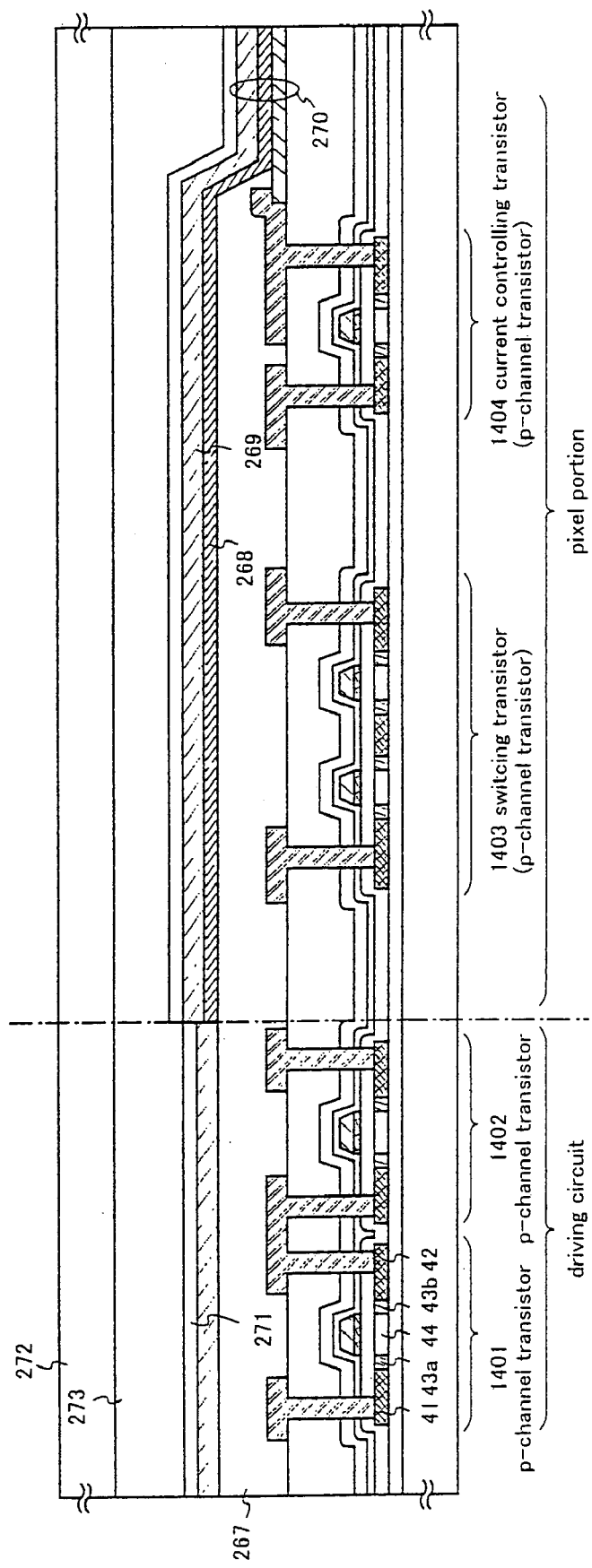
FIG. 16 is a diagram showing a sectional structure of a light emitting device.

This embodiment describes a case in which p-channel transistors are used for all of transistors that constitute a pixel portion and a driving circuit. The sectional structure of a light emitting device according to this embodiment is shown in FIG. 16. For the parts denoted by the same reference symbols as those in FIG. 5B, refer to explanations of Embodiment 1.

In this embodiment, the driving circuit is composed of a PMOS circuit that has a p-channel transistor 1401 and a p-channel transistor 1402 whereas the pixel portion has a switching transistor 1403 that is a p-channel transistor and a current controlling transistor 1404 that is a p-channel transistor. An active layer of the p-channel transistor 1401 includes a source region 41, a drain region 42, LDD regions 43a and 43b, and a channel formation region 44. The p-channel transistor 1402, the switching transistor 1403, and the current controlling transistor 1404 have the same active layer structure as the p-channel transistor 1401.

Now, a process of manufacturing a p-channel transistor in accordance with this embodiment will be described with reference to FIGS. 17A to 17C. First, the manufacture process of Embodiment 1 are finished up through the step of FIG. 3B.

Next, electrodes 212 to 216 are formed from a second conductive film using resists 211a to 211e. The resists 211a to 211e and the electrodes 212 to 216 formed of the second conductive film are then used as masks to dope a semiconductor film with an element belonging to Group 13 in the periodic table (boron, in this embodiment). As a result, regions 301 to 309 containing boron in a concentration of $1\times10^{20}$ to $1\times10^{21}$ atoms/cm$^3$ (hereinafter referred to as p type impurity regions (a)) are formed (FIG. 17A).

The electrodes 212 to 216 formed of the second conductive film are then etched using the resists 211a to 211e under the same etching conditions as those in FIG. 3E to form second gate electrodes 310 to 314 (FIG. 17B).

Next, the resists 211a to 211e and the second gate electrodes 310 to 314 are used as masks to etch a first conductive film 209 under the same etching conditions as those in FIG. 3D to form first gate electrodes 315 to 319.

The resists 211a to 211e and the second gate electrodes 310 to 314 are then used as masks to dope the semiconductor film with an element belonging to Group 13 in the periodic table (boron, in this embodiment). As a result, regions 320 to 329 containing boron in a concentration of $1\times10^{16}$ to $1\times10^{19}$ atoms/cm$^3$, typically $1\times10^{17}$ to $1\times10^{18}$ atoms/cm$^3$ (hereinafter referred to as p type impurity regions (b)) are formed (FIG. 17C).

The subsequent steps are the same as the step of FIG. 4C and the following steps thereof in Embodiment 1. A light emitting device structured as shown in FIG. 16 is manufactured through the above process.

The p-channel transistors used in this embodiment may be all enhancement type transistors or depression type transistors. Alternatively, enhancement type transistors and depression type transistors may be used in combination.

Figure 18:
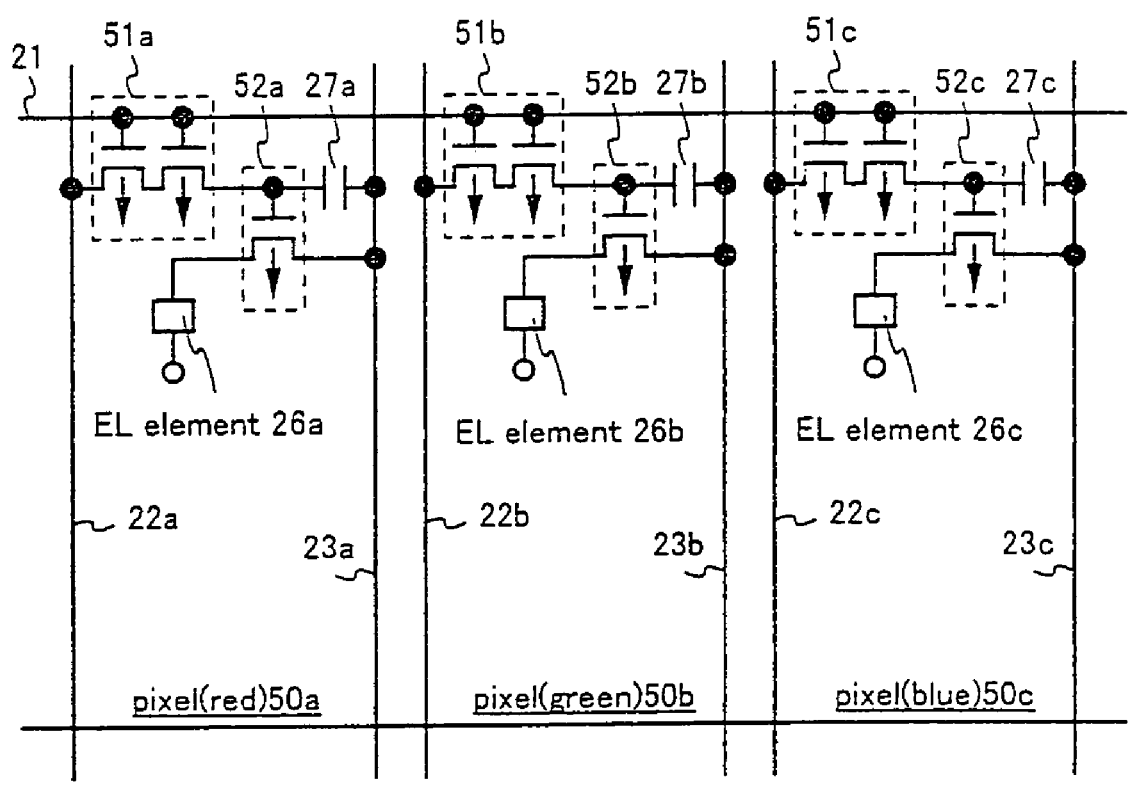
FIG. 18 is a diagram showing the circuit structure of pixels in a light emitting device.

The circuit structure of pixels is shown in FIG. 18. For the parts denoted by the same reference symbols as those in FIGS. 13A and 13B, refer to explanations of FIGS. 13A and 13B.

As shown in FIG. 18, switching transistors 51a to 51c and current controlling transistors 52a to 52c provided in a pixel (RED) 50a, a pixel (GREEN) 50b, and a pixel (BLUE) 50c, respectively, are all p-channel transistors.

According to the structure of this embodiment, one photolithography step in the process of manufacturing a light emitting device of Embodiment 1 is omitted. Therefore the manufacture process is more simplified than Embodiment 1.

The structure of this embodiment may be combined with any of the structures of Embodiments 1 through 4.

Embodiment 6

An active matrix light emitting device of the present invention can also employ an MOS (metal oxide semiconductor) transistor for a semiconductor element. In this case, a MOS transistor formed on a semiconductor substrate (typically a silicon wafer) by a known method is used.

The structure of this embodiment, except for the semiconductor element, may be combined with any of the structures of Embodiments 1 through 5.

Embodiment 7

Embodiment 1 shows in FIGS. 6A and 6B the light emitting device with built-in driving circuit as an example of the light emitting device in which a pixel portion and a driving circuit are integrally formed on the same insulator. However, it is also possible to use an external IC (integrated circuit) for the driving circuit. In this case, the structure thereof is as shown in FIG. 19A.

Figure 19A:
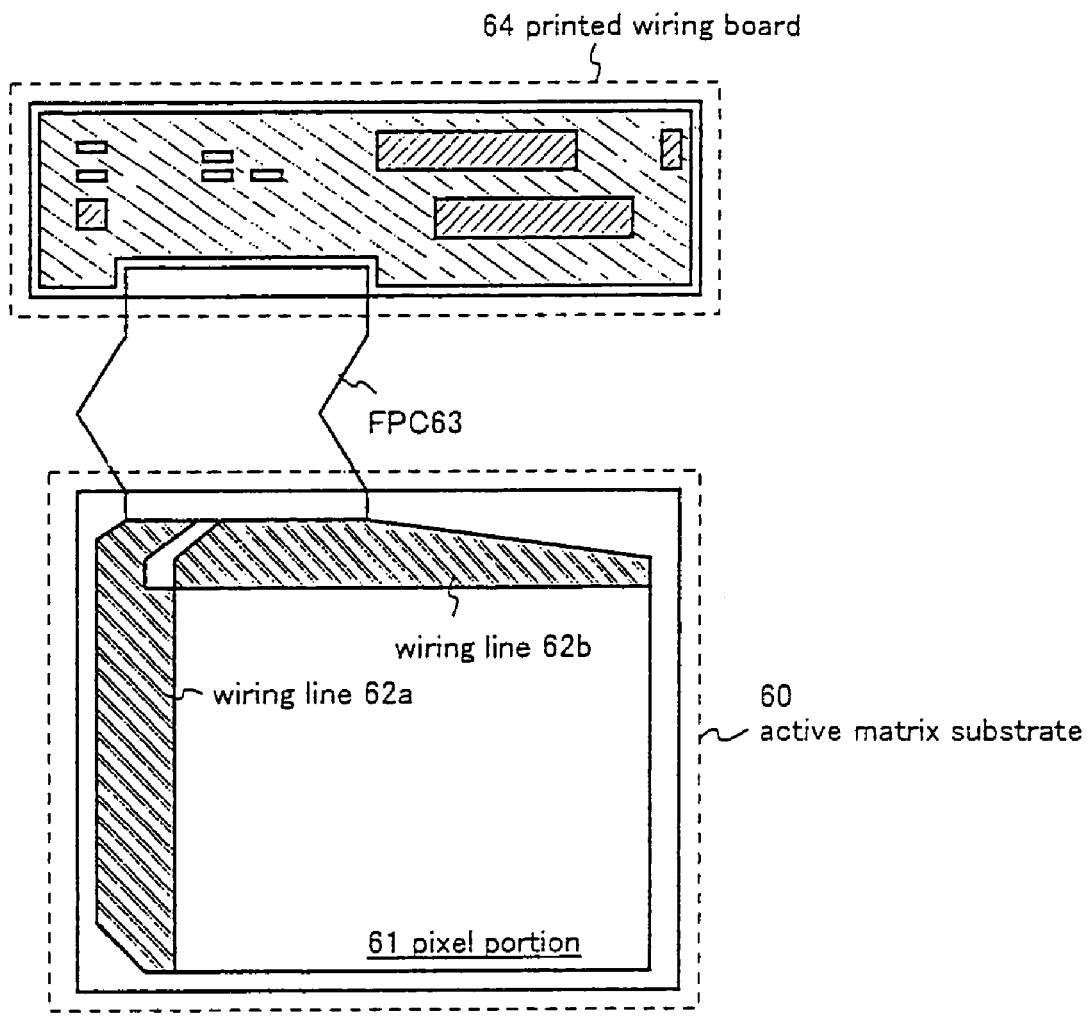
FIGS. 19A and 19B are diagrams showing the structure of a light emitting device with external driving circuit.

In a module shown in FIG. 19A, an FPC 63 is attached to an active matrix substrate 60 (including a pixel portion 61 and wiring lines 62a and 62b), and a printed wiring board 64 is attached to the substrate through the FPC 63. A functional block diagram of the printed wiring board 64 is shown in FIG. 19B.

Figure 19B:
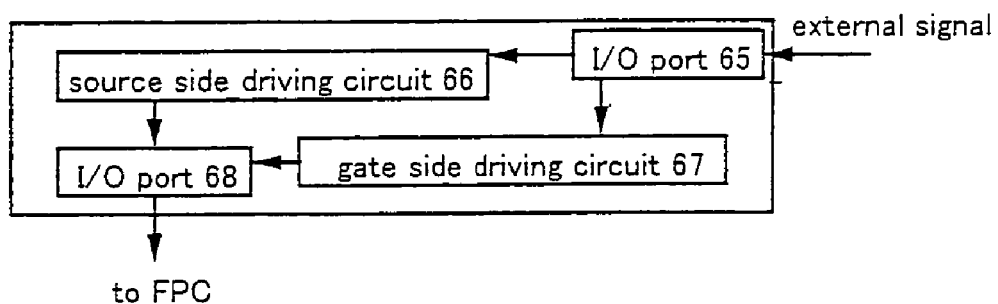

As shown in FIG. 19B, the printed wiring board 64 is provided with an IC functioning as at least I/O ports (also called input or output units) 65 and 68, a source side driving circuit 66, and a gate side driving circuit 67.

A module in which an FPC is attached to an active matrix substrate with a pixel portion formed thereon and a printed wiring board functioning as a driving circuit is attached to the substrate through the FPC, as in the module above, is specially called a light emitting module with external driving circuit in this specification.

Figure 20A:
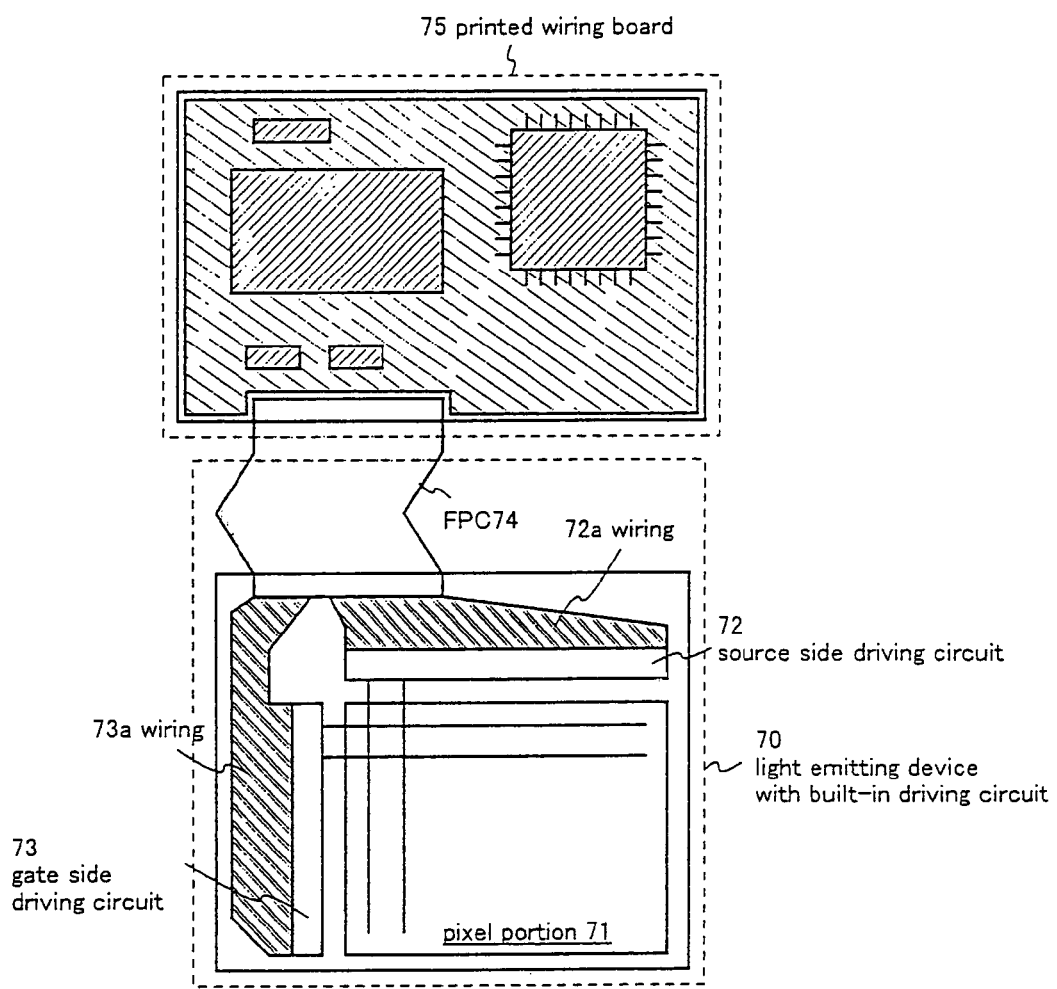
FIGS. 20A and 20B are diagrams showing the structure of a light emitting device with external controller.

In a module shown in FIG. 20A, an FPC 74 is attached to a light emitting device with built-in driving circuit 70 (including a pixel portion 71, a source side driving circuit 72, a gate side driving circuit 73, and wiring lines 72a and 73a), and a printed wiring board 75 is attached to the light emitting device with built-in driving circuit 70 through the FPC 74. A functional block diagram of the printed wiring board 75 is shown in FIG. 20B.

Figure 20B:
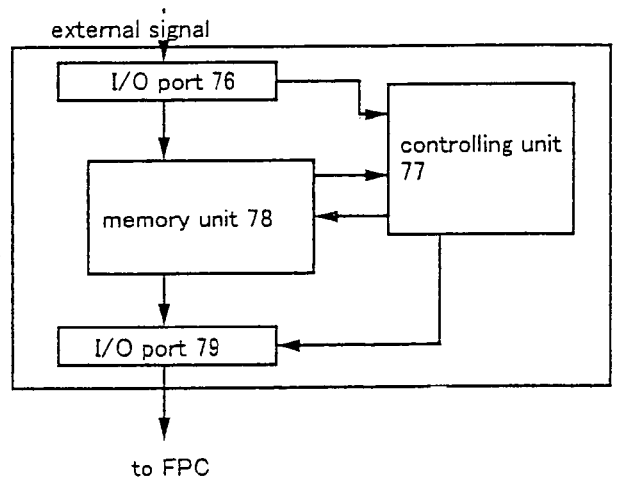

As shown in FIG. 20B, the printed wiring board 75 is provided with an IC functioning as at least I/O ports 76 and 79 and a controlling unit 77. Although a memory unit 78 is provided here, it is not always necessary. The controlling unit 77 has a function of controlling the driving circuits and correcting video data.

A module in which a printed wiring board having a function as a controller is attached to a light emitting device with built-in driving circuit with the driving circuit and a pixel portion formed on a substrate, as in the module above is specially called a light emitting module with external controller in this specification.

Embodiment 8

The light-emitting device (including the module at the state of which is shown in Embodiment 9) formed by implementing this invention may be built in various electrical appliances and thereof pixel portion is used as a image display portion. As electrical appliances of this invention, there are a video camera, a digital camera, a goggle type display (head mounted display), a navigation system, an audio apparatus, a note type personal computer, a game apparatus, a portable information terminal (such as a mobile computer, a portable telephone, a portable game apparatus or an electronic book), and an image playback device with a recording medium. Specific examples of the electronic equipment are shown in FIGS. 21 and 22.

Figure 21A:
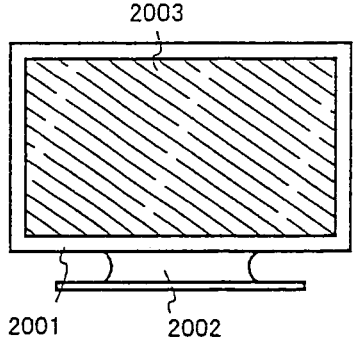
FIGS. 21A to 21F are diagrams showing specific examples of an electric machine.

FIG. 21A shows a display and includes a casing 2001, a supporting base 2002 and a display portion 2003. The light-emitting device of this invention may be used for the display portion 2003. When using the light-emitting device having the EL element in the display portion 2003, since the EL element is a self-light emitting type backlight is not necessary and the display portion may be made thin.

Figure 21B:
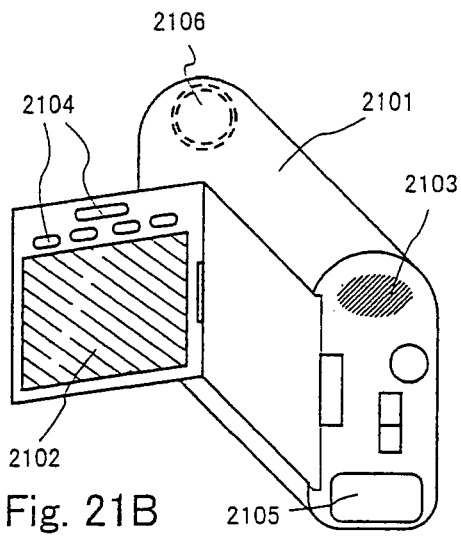

FIG. 21B shows a video camera, which contains a main body 2101, a display portion 2102, a sound input portion 2103, operation switches 2104, a battery 2105, and an image receiving portion 2106. The light-emitting device of this invention can be applied to the display portion 2102.

Figure 21C:
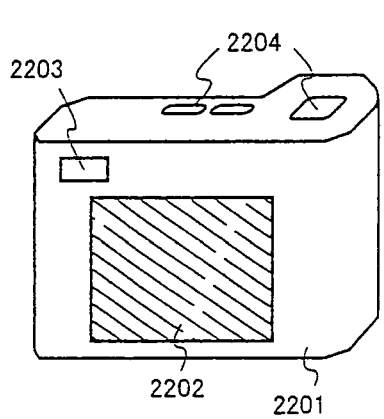

FIG. 21C shows a digital camera, which contains a main body 2201, a display portion 2202, an eye contact portion 2203, and operation switches 2204. The light emitting-device and the liquid crystal display device of this invention can be applied to the display portion 2202.

Figure 21D:
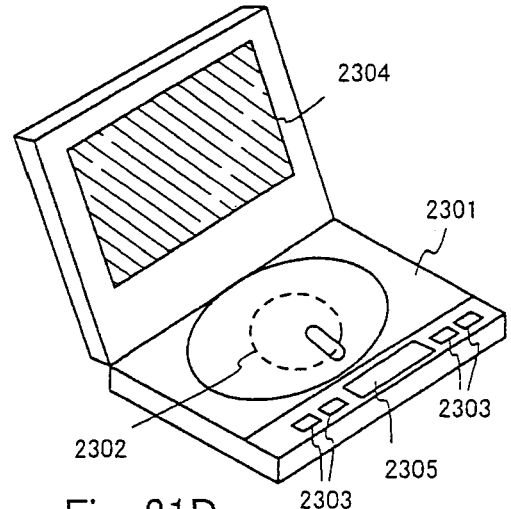

FIG. 21D shows an image playback device equipped with a recording medium (specifically, a DVD playback device), which contains a main body 2301, a recording medium (such as a CD, LD or DVD) 2302, operation switches 2303, a display portion (a) 2304, a display portion (b) 2305. The display portion (a) is mainly used for displaying image information. The display portion (b) 2305 is mainly used for displaying character information. The light-emitting device of this invention can be applied to the display portion (a) and the display portion (b). Note that, the image playback device equipped with the recording medium includes devices such as CD playback device, and game machines.

Figure 21E:
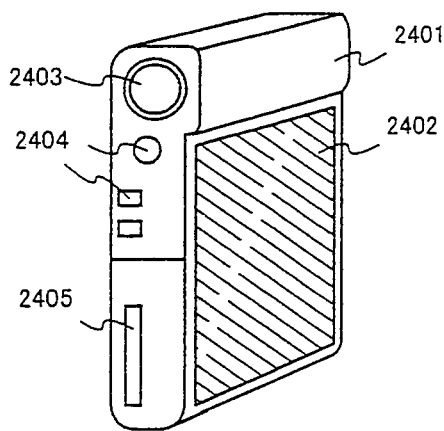

FIG. 21E shows a portable (mobile) computer, which contains a main body 2401, a display portion 2402, an image receiving portion 2403, operation switches 2404 and a memory slot 2405. The light-emitting device of this invention can be applied to the display portion 2402. This portable computer may record information to a recording medium that has accumulated flash memory or involatile memory, and playback such information.

Figure 21F:
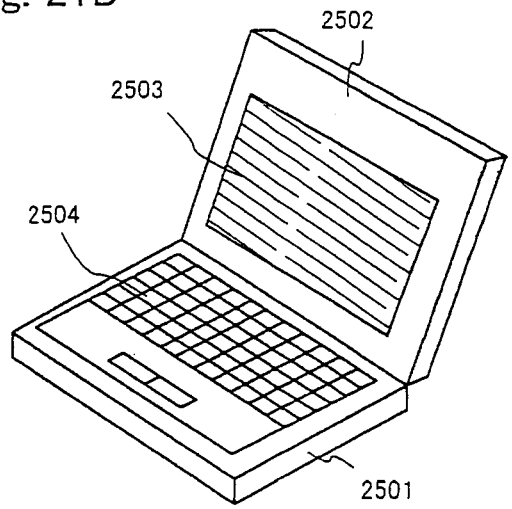

FIG. 21F shows a personal computer, which contains a main body 2501, a casing 2502, a display portion 2503, and a keyboard 2504. The light-emitting device of this invention can be applied to the display portion 2503.

The above electronic appliances more often display information sent through electron communication circuits such as Internet or the CATV (cable television), and especially image information display is increasing. When using the Light-emitting device having the EL element in the display portion, since the response speed of the EL element is extremely fast, it becomes possible to display pictures without delay.

Further, since the light emitting portion of the light-emitting device consumes power, it is preferable to display information so that the light emitting portion is as small as possible. Therefore, when using the light-emitting device in the display portion where character information is mainly shown in the portable information terminal, especially in a portable phone or an audio apparatus, it is preferable to drive so that the character information is formed of a light emitting portion with the non-light emitting portion as a background.

Figure 22A:
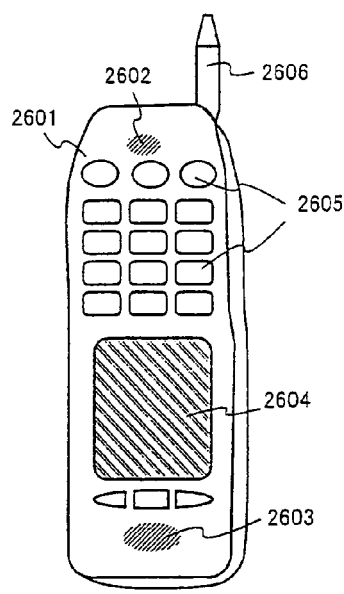
FIGS. 22A to 22F are diagrams showing specific examples of an electric machine.

Here, FIG. 22A shows a portable telephone, which contains a main body 2601, a sound output portion 2602, a sound input portion 2603, a display portion 2604, an operation switch 2605 and an antenna 2606. The light-emitting device of this present invention can be applied to the display portion 2604. Note that, when using the light-emitting device to the display portion 2604, the consumption power of the portable telephone may be suppressed by displaying white letters in the background of the black color.

Figure 22B:
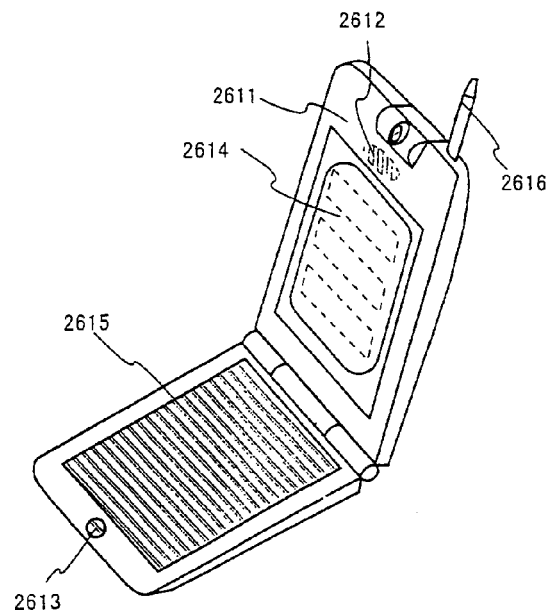
Figure 22C:
Figure 22D:
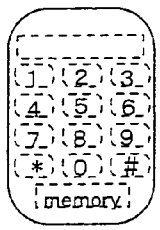
Figure 22E:
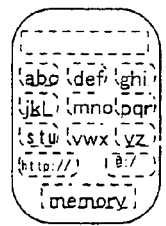

FIG. 22B shows also a portable telephone, but it is a folding twice type different from that of FIG. 22A, and contains a main body 2611, a sound output portion 2612, a sound input portion 2613, a display portion (a) 2614, a display portion (b) 2615 and an antenna 2616. The operation switch is not adhered to this type portable telephone, but its function is provided to the portable telephone by displaying a character information shown in FIGS. 22C, 22D and 22E by either of the display portion (a) or (b). Further, another display portion displays mainly the image information. The light-emitting device of the present invention can be used as the display portion (a) 2614 or a display portion (b) 2615.

In the case of the portable telephone shown in FIG. 22B, the light-emitting device used in the display portion 2604 is incorporated with a sensor by a CMOS circuit (a CMOS sensor), and may be used as an authentication system terminal for authenticating the user by reading the fingerprints or the hand of the user. Further, light emission may be performed by taking into consideration the brightness (illumination) of outside and making information display at a contrast that is already set.

Further, the low power consumption may be attained by decreasing the brightness when using the operating switch 2605 and increasing the brightness when the use of the operation switch is finished. Further, the brightness of the display portion 2604 is increased when a call is received, and low power consumption is attained by decreasing the brightness during a telephone conversation. Further, when using the telephone continuously, by making it have a function so that display is turned off by time control unless it is reset, low power consumption is realized. It should be noted that this control may be operated by hand.

Figure 22F:
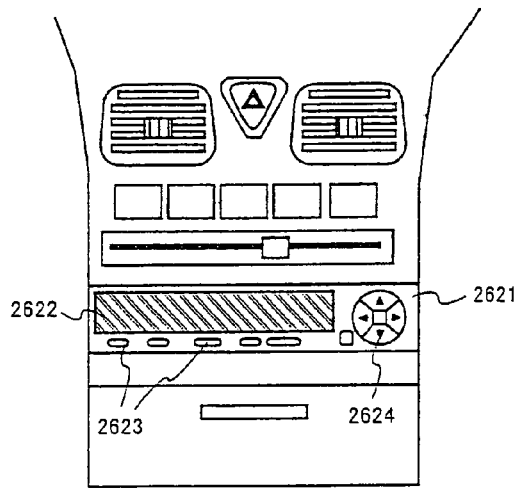

Further, FIG. 22F shows an audio reproduction devices, concretely a car audio which contains a main body 2621, a display portion 2622, and operation switches 2623 and 2624. The light-emitting device of this invention can be applied to the display portion 2622. Further, in this embodiment, a car mounted audio (car audio) is shown, but it may be used in a portable type or domestic type audio (audio component). Note that, when using a light-emitting device in the display portion 2622, by displaying white characters in a black background, power consumption may be suppressed. It is especially effective for the portable type audio reproduction device.

In the case of the portable type electronic apparatuses shown in this embodiment, the sensor portion is provided to perceive the external light and the function to lower the brightness of display when it is used in the dark area as a method to lower the power consumption.

As in the above, the applicable range of this invention is extremely wide, and may be used for various electrical equipment. Further, the electrical equipment of this embodiment may use the electronic device containing any of the structures of Embodiments 1 to 8.

Embodiment 9

Figure 23A:
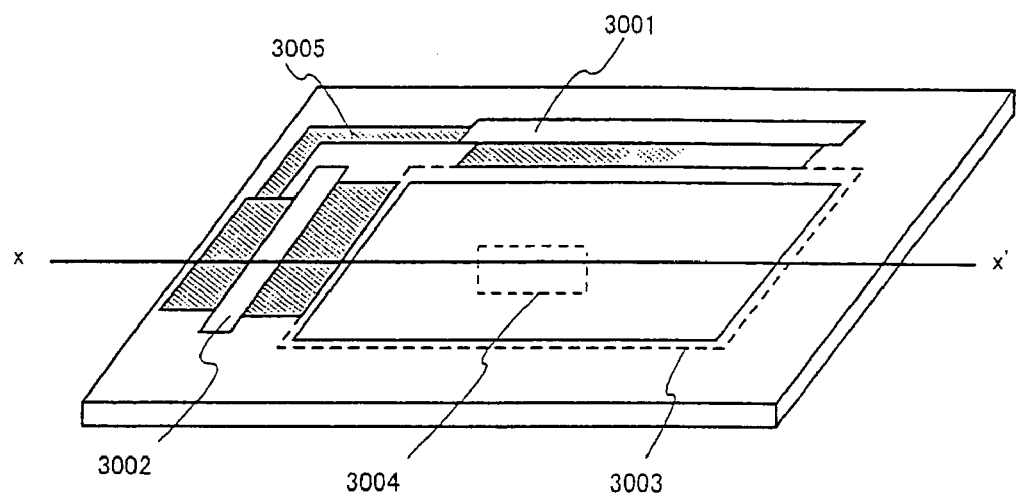
FIGS. 23A and 23B are diagrams respectively showing a top structure of a light emitting device and a sectional structure thereof.
Figure 23B:
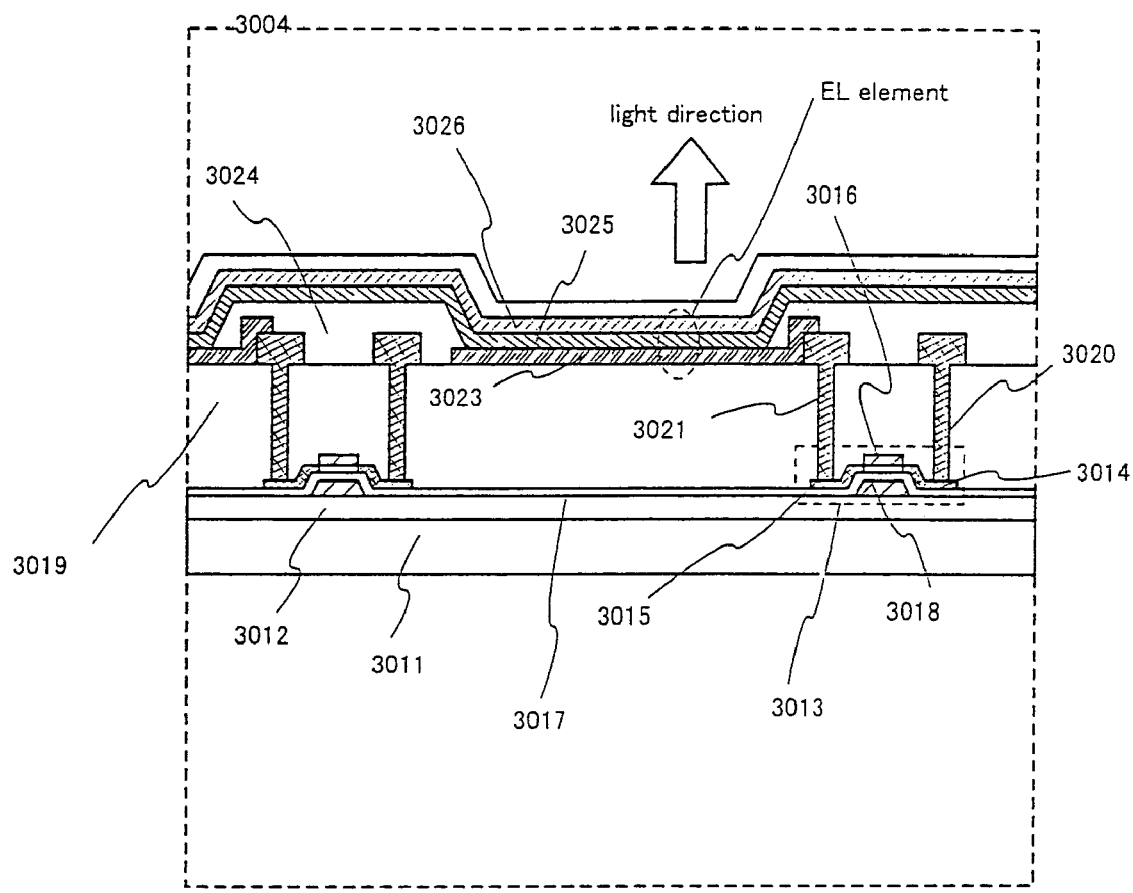

Embodiment 1 describes a case where the transistors are top gate transistors. However, the transistor structure of the present invention is not limited thereto and bottom gate transistors (typically reverse stagger transistors) may also be used in carrying, out the present invention as shown in FIGS. 23A and 23B. The reverse stagger transistors may be formed by any method.

FIG. 23A is a top view of an EL module formed in manufacture of a light emitting device that uses bottom gate transistors. A source side driving circuit 3001, a gate side driving circuit 3002, and a pixel portion 3003 are formed therein. FIG. 23B shows in section a region a 3004 of the pixel portion 3003. The sectional view is obtained by cutting the light emitting device along the line x-x' in FIG. 23A.

FIG. 23B illustrates only a current controlling transistor out of transistors that constitute a pixel transistor. Reference symbol 3011 denotes a substrate and 3012 denotes an insulating film to serve as a base (hereinafter referred to as a base film). A transparent substrate is used for the substrate 3011, typically, a glass substrate, a quartz substrate, a glass ceramic substrate, or a crystallized glass substrate. However, the one that can withstand the highest process temperature during the manufacture process has to be chosen.

The base film 3012 is effective especially when a substrate containing a movable ion or a conductive substrate is used. If a quartz substrate is used, the base film may be omitted. An insulating film containing silicon is used for the base film 3012. The term insulating film containing silicon herein refers to an insulating film containing oxygen or nitrogen in a given ratio to the content of silicon, specifically, a silicon oxide film, a silicon nitride film, or a silicon oxynitride film ($SiO_xN_y$: x and v are arbitrary integers).

Reference symbol 3013 denotes a current controlling transistor that is a p-channel transistor. When an EL emits light toward the top face of the substrate (the face on which transistors and an EL layer are formed) as shown in this embodiment, it is desirable to use n-channel transistors for a switching transistor and a current controlling transistor as well. However, the present invention is not limited to thereto. The switching transistor may be an n-channel transistor or a p-channel transistor and the same applies to the current controlling transistor.

The current controlling transistor 3013 is composed of an active layer, a gate insulating film 3017, a gate electrode 3018, a first interlayer insulating film 3019, a source wiring line 3020, and a drain wiring line 3021. The active layer includes a source region 3014, a drain region 3015, and a channel formation region 3016. The current controlling transistor 3013 in this embodiment is an n-channel transistor.

The switching transistor has a drain region connected to the gate electrode 3018 of the current controlling transistor 3013. The gate electrode 3018 of the current controlling transistor 3013 is electrically connected to the drain region (not shown) of the switching transistor through a drain wiring line (not shown), to be exact. The gate electrode 3018 has a single gate structure but may take a multi-gate structure. The source wiring line 3020 of the current controlling transistor 3013 is connected to a current supplying line (not shown).

The current controlling transistor 3013 is an element for controlling the amount of current supplied to the EL element, and a relatively large amount of current flows through this transistor. Therefore, it is preferable to design the current controlling transistor to have a channel width (W) wider than the channel width of the switching transistor. It is also preferable to design the current controlling transistor to have a rather long channel length (L) in order to avoid excessive current flow in the current controlling transistor 3013. Desirably, the length is set such that the current is 0.5 to 2 µA (preferably 1 to 1.5 µA) per pixel.

If the active layer (channel formation region, in particular) of the current controlling transistor 3013 is formed thick (desirably 50 to 100 nm more desirably 60 to 80 nm), degradation of the transistor can be slowed.

After the current controlling transistor 3013 is formed, the first interlayer insulating film 3019 and a second interlayer insulating film (not shown) are formed to form a pixel electrode 3023 that is electrically connected to the current controlling transistor 3013. In this embodiment, the pixel electrode 3023 formed of a conductive film functions as a cathode of the EL element.

Specifically, the pixel electrode is formed of an alloy film of aluminum and lithium. Any conductive film formed of an element belonging to Group 1 or 2 in the periodic table or a conductive film doped with the Group 1 (or 2) element can be used.

After the pixel electrode 3023 is formed, a third interlayer insulating film 3024 is formed. The third interlayer insulating film 3024 serves as a so-called bank.

An EL layer 3025 is formed next. Shown in FIG. 23B in section is a column of pixels that be formed the same EL layer.

The EL layer in this embodiment uses $Alq_3$ for an electron injection layer, BCP for an electron transporting layer, and CBP doped with Ir $(ppy)_3$ for a light emitting layer. A hole transporting layer thereof is formed of α-NPD.

Next, an anode 3026 is formed from a transparent conductive film on the EL layer. The transparent conductive film used in this embodiment is a conductive film formed from a compound of indium oxide and tin oxide, or a compound of indium oxide and zinc oxide.

A passivation film is further formed on the anode from an insulating material to thereby complete an EL module having a reverse stagger transistor structure. The light emitting device manufactured in accordance with this embodiment emits light in the direction indicated by the arrow in FIG. 23B (toward the top face).

A reverse stagger transistor can be fabricated with a smaller number of manufacture steps than needed to fabricate a top gate transistor. Therefore it is very advantageous for cost down, which is one of the objects of the present invention.

The structure of this embodiment may be combined freely with any of the structures of Embodiments 1 through 8.

Embodiment 10

Figure 24:
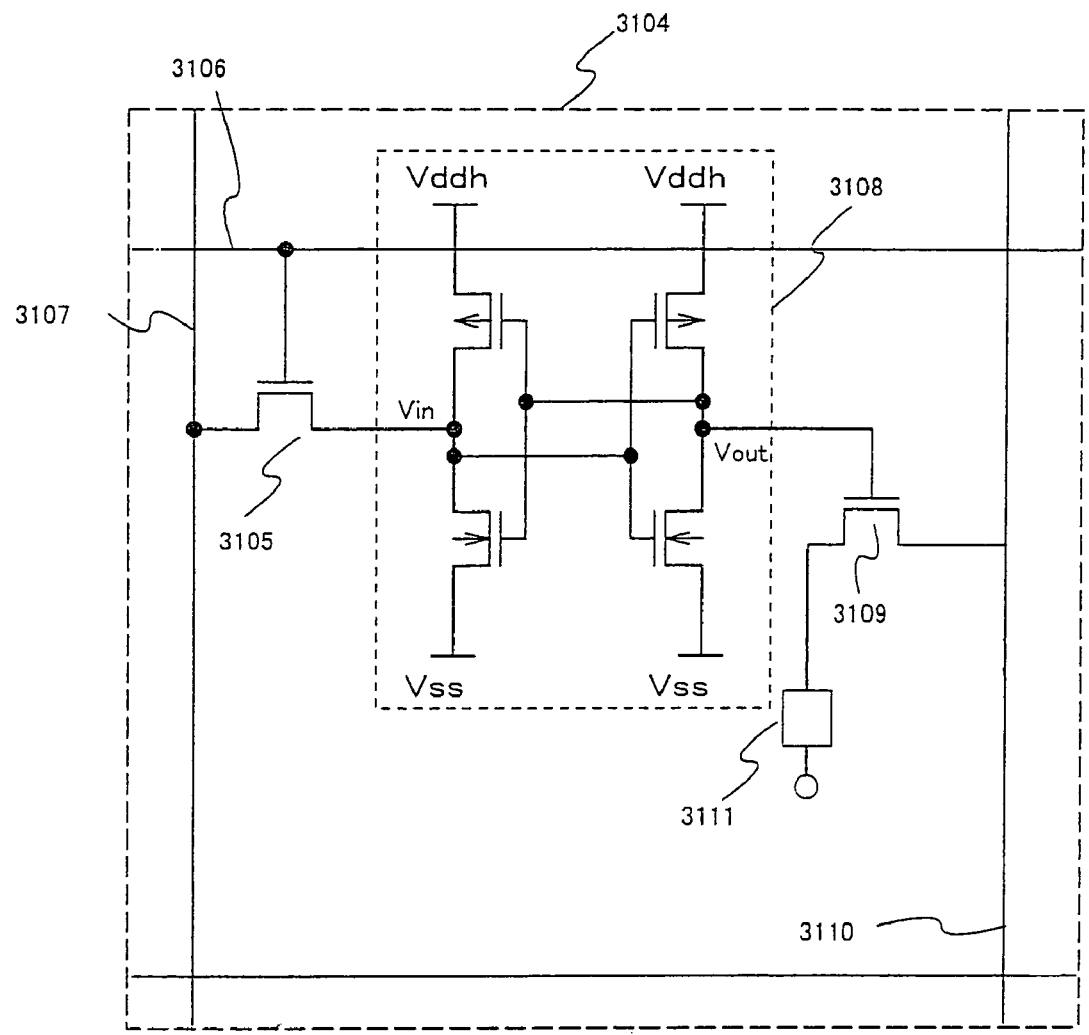
FIG. 24 is a diagram showing the circuit structure of pixels in a light emitting device.

Described next in this embodiment is a case of introducing an SRAM to a pixel portion. FIG. 24 shows an enlarged view of a pixel 3104. In FIG. 24, reference symbol 3105 denotes a switching transistor. The switching transistor 3105 has a gate electrode connected to a gate signal line 3106 that is one of gate signal lines (Gl to Gn) to which gate signals are inputted. The switching transistor 3105 has a source region and a drain region one of which is connected to a source signal line 3107 that is one of source signal lines (S1 to Sn) to which source signals are inputted, and the other of which is connected to an input side of an SRAM 3108. An output side of the SRAM 3108 is connected to a gate electrode of a current controlling transistor 3109.

The current controlling transistor 3109 has a source region and a drain region one of which is connected to a current supplying line 3110 that is one of current supplying lines (V1 to Vn), and the other of which is connected to an EL element 3111.

The EL element 3111 is composed of an anode, a cathode, and an EL layer interposed between the anode and the cathode. When the anode is connected to the source region or the drain region of the current controlling transistor 3109, in other words when the anode is a pixel electrode, the cathode serves as an opposite electrode. On the other hand, when the cathode is connected to the source region or the drain region of the current controlling transistor 3109, in other words, when the cathode is a pixel electrode, the anode serves as the opposite electrode.

The SRAM 3108 has two p-channel transistors and two n-channel transistors. Source regions of the p-channel transistors are connected to Vddh on the high voltage side whereas source regions of the n-channel transistors are connected to Vss on the low voltage side. One p-channel transistor and one n-channel transistor forms a pair, and one SRAM has two pairs of p-channel transistors and n-channel transistors.

A drain region of one p-channel transistor is connected to a drain region of the n-channel transistor of the pair. A gate electrode of one p-channel transistor is connected to a gate electrode of the n-channel transistor of the pair. Drain regions of the p-channel transistor and the n-channel transistor of one pair are kept at the same level of electric potential as gate electrodes of the p-channel transistor and the n-channel transistor of the other pair.

Drain regions of the p-channel transistor and the n-channel transistor of one pair receive input signals (Vin) and serve as the input side. Drain regions of the p-channel transistor and the n-channel transistor of the other pair send out output signals (Vout) and serve as the output side.

The SRAM is designed to hold Vin and output Vout that is a signal obtained by inverting Vin. When Vin is Hi, Vout is a Lo signal corresponding to Vss. When Vin is Lo, Vout is a Hi signal corresponding to Vddh.

In the case where one SRAM is provided in the pixel 3104 as shown in this embodiment, a still image can be displayed while stopping the operation of most of the external circuit because the memory data in the pixel is kept. This makes it possible to reduce power consumption. One pixel may have a plurality of SRAMs. A plurality of data can be held when plural SRAMs are provided in one pixel, making gray scale display by time gray scale possible.

The structure of this embodiment may be combined freely with any of the structures of Embodiments 1 through 9.

By carrying out the present invention, the luminance of light emitted from EL elements formed on the same substrate can readily be equalized and a low power consumption light emitting device that can emit light of high luminance with a low voltage can be obtained. Also, a low power consumption electric machine can be provided when this light emitting device is used in a display portion thereof.

What is claimed is:
1. A light emitting device comprising:
a substrate;
a first EL element over the substrate; and
a second EL element over the substrate,
wherein the first EL element comprises a first EL layer comprising a triplet compound, wherein the second EL element comprises a second EL layer comprising a singlet compound, and wherein at least one of the first and second EL layers comprises a plurality of hole transporting layers.

2. A light emitting device according to claim 1, wherein the hole transporting layer includes at least a layer containing α-NPD.

3. A light emitting device according to claim 2, wherein the layer containing α-NPD is in contact with the light emitting layer.

4. A light emitting device according to claim 1, wherein the triplet compound includes iridium.

5. A light emitting device comprising:
a first substrate;
a second substrate;
a flexible printed circuit;
a pixel portion including a first thin film transistor over the first substrate;
a driver circuit including a second thin film transistor over the second substrate;
wherein the pixel portion comprises a first EL element and a second EL element,
wherein the first EL element comprises a first EL layer comprising a triplet compound,
wherein the second EL element comprises a second EL layer comprising a singlet compound,
wherein at least one of the first and second EL layers comprises a plurality of hole transporting layers, and
wherein the first substrate and the second substrate are connected through the flexible printed circuit.

6. A light emitting device according to claim 5, wherein the hole transporting layer includes at least a layer containing α-NPD.

7. A light emitting device according to claim 6, wherein the layer containing α-NPD is in contact with the light emitting layer.

8. A light emitting device according to claim 5, wherein the triplet compound includes iridium.

9. A light emitting device comprising:
a substrate;
a pixel portion including a first thin film transistor over the substrate;
a driver circuit including a second thin film transistor over the substrate;
wherein the pixel portion comprises a first EL element and a second EL element,
wherein the first EL element comprises a first EL layer comprising a triplet compound,
wherein the second EL element comprises a second EL layer comprising a singlet compound, and
wherein at least one of the first and second EL layers comprises a plurality of hole transporting layers.

10. A light emitting device according to claim 9, wherein the hole transporting layer includes at least a layer containing α-NPD.

11. A light emitting device according to claim 10, wherein the layer containing α-NPD is in contact with the light emitting layer.

12. A light emitting device according to claim 9, wherein the triplet compound includes iridium.

13. An image playback device comprising:
a main body comprising:
an operation switch; and
a display portion over a substrate and comprising:
a first EL element over the substrate; and
a second EL element over the substrate,
wherein the first EL element comprises a first EL layer comprising a triplet compound,
wherein the second EL element comprises a second EL layer comprising a singlet compound, and
wherein at least one of the first and second EL layers comprises a plurality of hole transporting layers.

14. An image playback device according to claim 13, wherein the hole transporting layer includes at least a layer containing α-NPD.

15. An image playback device according to claim 14, wherein the layer containing α-NPD is in contact with the light emitting layer.

16. An image playback device according to claim 13, wherein the triplet compound includes iridium.

17. An image playback device according to claim 13, wherein the image playback device is one selected from the group consisting of a DVD playback device, a CD playback device, and a game machine.

* * * * *